United States Patent
Cong et al.

(10) Patent No.: US 12,444,356 B2
(45) Date of Patent: Oct. 14, 2025

(54) DISPLAY SUBSTRATE, MANUFACTURING METHOD THEREOF AND DISPLAY APPARATUS

(71) Applicants: BEIJING BOE DISPLAY TECHNOLOGY CO., LTD., Beijing (CN); BOE Technology Group Co., Ltd., Beijing (CN)

(72) Inventors: Ning Cong, Beijing (CN); Longfei Fan, Beijing (CN); Dachao Li, Beijing (CN); Can Zhang, Beijing (CN); Minghua Xuan, Beijing (CN); Xiaochuan Chen, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/267,788

(22) PCT Filed: Jul. 29, 2022

(86) PCT No.: PCT/CN2022/108886
§ 371 (c)(1),
(2) Date: Jun. 16, 2023

(87) PCT Pub. No.: WO2024/021001
PCT Pub. Date: Feb. 1, 2024

(65) Prior Publication Data
US 2024/0395200 A1    Nov. 28, 2024

(51) Int. Cl.
*G09G 3/3233* (2016.01)
*H10K 59/12* (2023.01)
(Continued)

(52) U.S. Cl.
CPC ....... *G09G 3/3233* (2013.01); *H10K 59/1201* (2023.02); *H10K 59/1213* (2023.02); *H10K 59/1216* (2023.02); *H10K 59/1315* (2023.02)

(58) Field of Classification Search
CPC ............. G09G 3/3233; H10K 59/1201; H10K 59/1213; H10K 59/1216; H10K 59/1315
See application file for complete search history.

(56) References Cited

U.S. PATENT DOCUMENTS

| | | |
|---|---|---|
| 2010/0164844 A1 | 7/2010 | Lin et al. |
| 2017/0236885 A1 | 8/2017 | Koshihara et al. |

(Continued)

FOREIGN PATENT DOCUMENTS

| | | |
|---|---|---|
| CN | 108172597 A | 6/2018 |
| CN | 108877664 A | 11/2018 |

(Continued)

*Primary Examiner* — Benjamin C Lee
*Assistant Examiner* — Nathan P Brittingham
(74) *Attorney, Agent, or Firm* — Ling Wu; Stephen Yang; Ling and Yang Intellectual Property

(57) ABSTRACT

A display substrate, a manufacturing method thereof and a display apparatus are provided. The display substrate includes multiple sub-pixels, a sub-pixel includes a first region (q1), a gap region (q3) and a second region (q2); the sub-pixel includes a first transistor (T1) including first active layer (1) and first gate electrode (11), a second transistor (T2) including second active layer (2) and second gate electrode (12) and a third transistor (T3) including third active layer (3) and third gate electrode (13); the first active layer is disposed in the first region, the second active layer and the third active layer are disposed in the second region, and via holes through which the first gate electrode and the third gate electrode are connected to a scan signal line and (Continued)

a via hole through which the second gate electrode is connected to the first transistor are provided in the gap region.

20 Claims, 26 Drawing Sheets

(51) Int. Cl.
*H10K 59/121* (2023.01)
*H10K 59/131* (2023.01)

(56) References Cited

U.S. PATENT DOCUMENTS

| | | | |
|---|---|---|---|
| 2018/0158878 A1 | 6/2018 | Lee et al. | |
| 2019/0325823 A1 | 10/2019 | Yang et al. | |
| 2020/0203448 A1 | 6/2020 | Kim et al. | |
| 2021/0202603 A1 | 7/2021 | Wu et al. | |
| 2022/0020842 A1* | 1/2022 | Baek | H10K 59/38 |
| 2023/0247878 A1* | 8/2023 | Jo | H10K 59/1315 257/40 |
| 2023/0363223 A1 | 11/2023 | Zhang et al. | |

FOREIGN PATENT DOCUMENTS

| | | |
|---|---|---|
| CN | 110571245 A | 12/2019 |
| CN | 111354767 A | 6/2020 |
| CN | 112331714 A | 2/2021 |
| CN | 112951892 A | 6/2021 |
| CN | 113362766 A | 9/2021 |
| CN | 113366563 A | 9/2021 |
| CN | 113838424 A | 12/2021 |
| CN | 114242755 A | 3/2022 |
| EP | 3324392 A2 | 5/2018 |
| JP | 2017146336 A | 8/2017 |
| WO | 2021217413 A1 | 11/2021 |

* cited by examiner

DISPLAY SUBSTRATE, MANUFACTURING METHOD THEREOF AND DISPLAY APPARATUS

CROSS-REFERENCE TO RELATED APPLICATION

The present application is a U.S. National Phase Entry of International Application No. PCT/CN2022/108886 having an international filing date of Jul. 29, 2022, the content of which is incorporated into this application by reference.

TECHNICAL FIELD

The present disclosure relates to, but is not limited to, the field of display technology, and more particularly, to a display substrate, a manufacturing method thereof and a display apparatus.

BACKGROUND

Micro organic light emitting diodes (Micro OLEDs) are micro displays developed in recent years, among which a silicon-based OLED is one type thereof. The silicon-based OLED can implement not only active addressing of pixels, but also manufacturing of structures such as pixel driving circuits on a silicon base, so as to facilitate reduction of system volume to implement lightweight. The silicon-based OLED, which is manufactured using mature complementary metal oxide semiconductor (CMOS) integrated circuit technologies, has advantages such as a small size, a high pixels per inch (PPI), a high refresh rate, etc.

SUMMARY

The following is a summary of subject matters described in the present disclosure in detail. The summary is not intended to limit the protection scope of the claims.

In one aspect, an embodiment of the present disclosure provides a display substrate including a display area and a border area. The display area includes a plurality of sub-pixels forming a plurality of pixel rows and a plurality of pixel columns, a sub-pixel includes a first region, a gap region and a second region arranged in sequence along a pixel row direction; at least one sub-pixel includes a pixel driving circuit, a first scan signal line and a second scan signal line, the pixel driving circuit at least includes a first transistor, a second transistor and a third transistor, the first scan signal line is configured to control turning-on or turning-off of the first transistor, and the second scan signal line is configured to control turning-on or turning-off of the second transistor; the first transistor at least includes a first gate electrode, a first active layer, a first electrode and a second electrode of the first transistor, the second transistor at least includes a second gate electrode and a second active layer, and the third transistor at least includes a third gate electrode and a third active layer; the first active layer is disposed in the first region, the second active layer and the third active layer are disposed in the second region, and the second active layer is disposed at one side of the third active layer in a pixel column direction; the first scan signal line is connected to the first gate electrode through a first gate via hole, the second electrode of the first transistor is connected to the second gate electrode through a second gate via hole, the second scan signal line is connected to the third gate electrode through a third gate via hole, and the first gate via hole, the second gate via hole and the third gate via hole are provided in the gap region.

In an exemplary embodiment, along the pixel row direction, the first region has a first width, the second region has a second width, and the gap region has a third width, the third width is less than or equal to 0.5*the first width, and the third width is less than or equal to 0.5*the second width.

In an exemplary embodiment, first gate electrodes of two adjacent sub-pixels in a pixel row are connected to each other to form an integrated structure, and third gate electrodes of two adjacent sub-pixels in a pixel row are connected to each other to form an integrated structure.

In an exemplary embodiment, the first gate electrodes of the integrated structure are connected to the first scan signal line through two first gate via holes, and the third gate electrodes of the integrated structure are connected to the second scan signal line through two third gate via holes.

In an exemplary embodiment, first transistors, second transistors and third transistors of two adjacent sub-pixels in a pixel row are mirror symmetrical with respect to a pixel centerline, which is a straight line located between the two adjacent sub-pixels in a pixel row and extending along the pixel column direction.

In an exemplary embodiment, in at least one sub-pixel, the first gate electrode includes a first gate body portion and a first gate connection portion connected to each other, the first gate connection portion is disposed in the gap region, and the first scan signal line is connected to the first gate connection portion through the first gate via hole.

In an exemplary embodiment, in at least one sub-pixel, the second gate electrode includes a second gate body portion and a second gate connection portion connected to each other, the second gate connection portion is disposed in the gap region, and the second electrode of the first transistor is connected to the second gate connection portion through the second gate via hole.

In an exemplary embodiment, in at least one sub-pixel, the third gate electrode includes a third gate body portion and a third gate connection portion connected to each other, the third gate connection portion is disposed in the gap region, and the second scan signal line is connected to the third gate connection portion through the third gate via hole.

In an exemplary embodiment, in at least one sub-pixel, the first gate electrode includes a first gate body portion and a first gate connection portion connected to each other, the first gate connection portion is disposed at one side of the first gate body portion close to the third gate electrode, and the third gate electrode includes a third gate body portion and a third gate connection portion connected to each other, the third gate connection portion is disposed at one side of the third gate body portion close to the first gate electrode, and the first gate connection portion and the third gate connection portion are interlaced in the pixel column direction.

In an exemplary embodiment, an edge of the first gate body portion and an edge of the first gate connection portion that are away from the second transistor are flush, and an edge of the third gate body portion and an edge of the third gate connection portion that are close to the second transistor are flush.

In an exemplary embodiment, in at least one sub-pixel, the second gate electrode includes a second gate body portion and a second gate connection portion connected to each other, the second gate connection portion is disposed in the gap region, and an edge of the second gate body portion and an edge of the second gate connection portion that are close to the third transistor are flush.

In an exemplary embodiment, a main part of the first scan signal line and a main part of the second scan signal line are in a shape of a line extending along the pixel row direction, an orthographic projection of the first scan signal line on a plane of the display substrate overlaps at least partially with orthographic projections of the first gate electrode and the third gate electrode on the plane of the display substrate, and an orthographic projection of the second scan signal line on the plane of the display substrate overlaps at least partially with the orthographic projections of the first gate electrode and the third gate electrode on the plane of the display substrate.

In an exemplary embodiment, the second transistor further includes a first electrode and a second electrode of the second transistor, and the third transistor further includes a first electrode and a second electrode, the first electrode of the first transistor is connected to a data signal line, the first electrode of the second transistor is connected to a light emitting voltage line, the first electrode of the third transistor is connected to a reference signal line, and the second electrode of the second transistor and the second electrode of the third transistor are connected to each other to form an integrated structure.

In an exemplary embodiment, in at least one sub-pixel, the pixel driving circuit further includes a storage capacitor including a first plate and a second plate, an orthographic projection of the first plate on a plane of the display substrate overlapping at least partially with an orthographic projection of the second plate on the plane of the display substrate, the first plate is connected to the second electrode of the first transistor through a connection electrode, and the second plate is connected to a first power supply line.

In an exemplary embodiment, at least one sub-pixel further includes a contact electrode disposed in the first region, the contact electrode is disposed at one side of the first active layer in the pixel column direction.

In an exemplary embodiment, at least one sub-pixel further includes a bias voltage line connected to the contact electrode through a via hole, an orthographic projection of the bias voltage line on a plane of the display substrate overlapping at least partially with an orthographic projection of the second gate electrode on the plane of the display substrate.

In an exemplary embodiment, in at least one sub-pixel, the contact electrode is in a shape of a strip extending along the pixel column direction, the bias voltage line is in a shape of a line extending along the pixel row direction, a bias connection line is connected at one or both sides of the bias voltage line in the pixel column direction, an orthographic projection of the bias connection line on the plane of the display substrate overlaps at least partially with an orthographic projection of the contact electrode on the plane of the display substrate, and the bias connection line is connected to the contact electrode through a via hole.

In an exemplary embodiment, the bias voltage line and the bias connection line are connected to each other to form an integrated structure.

In an exemplary embodiment, the border area at least includes a light emitting control transistor, a gate electrode of the light emitting control transistor is connected to a light emitting control line, a first electrode of the light emitting control transistor is connected to a border power supply lead, a second electrode of the light emitting control transistor is connected to the light emitting voltage line, which is connected to first electrodes of second transistors of a plurality of sub-pixels in a pixel row, and the border power supply lead is connected to the first power supply line.

In an exemplary embodiment, in a plane perpendicular to the display substrate, the display substrate at least includes a first conductive layer and a second conductive layer disposed in sequence on a silicon base, the silicon base at least includes the first active layer, the second active layer and the third active layer, the first conductive layer at least includes the first gate electrode, the second gate electrode and the third gate electrode, and the second conductive layer at least includes the first scan signal line and the second scan signal line.

In an exemplary embodiment, the display substrate further includes a third conductive layer, a fourth conductive layer, a fifth conductive layer, a sixth conductive layer, a seventh conductive layer and an eighth conductive layer disposed on one side of the second conductive layer away from the silicon base, the third conductive layer at least includes a data signal line and a reference signal line, the fourth conductive layer at least includes a light emitting voltage line, the sixth conductive layer at least including a first plate of a storage capacitor, the seventh conductive layer at least includes a second plate of the storage capacitor, and the eighth conductive layer at least includes an anode connection electrode and a first power supply line.

In another aspect, an example of the present disclosure provides a display apparatus, which includes the aforementioned display substrate.

In yet another aspect, an example of the present disclosure provides a manufacturing method of a display substrate including a display area and a border area, wherein the display area includes a plurality of sub-pixels forming pixel rows and pixel columns, a sub-pixel includes a first region, a gap region and a second region arranged in sequence along a pixel row direction; at least one sub-pixel includes a pixel driving circuit, a first scan signal line and a second scan signal line, the pixel driving circuit at least includes a first transistor, a second transistor and a third transistor, the first scan signal line is configured to control turning-on or turning-off of the first transistor, and the second scan signal line is configured to control turning-on or turning-off of the second transistor; the first transistor at least includes a first gate electrode, a first active layer, a first electrode and a second electrode of the first transistor, the second transistor at least includes a second gate electrode and a second active layer, and the third transistor at least includes a third gate electrode and a third active layer; the manufacturing method includes:

forming the first transistor, the second transistor, the third transistor, the first scan signal line and the second scan signal line, wherein the first active layer is disposed in the first region, the second active layer and the third active layer are disposed in the second region, and the second active layer is disposed at one side of the third active layer in a pixel column direction; the first gate electrode is connected to the first scan signal line through a first gate via hole, the second gate electrode is connected to the second electrode of the first transistor through a second gate via hole, the third gate electrode is connected to the second scan signal line through a third gate via hole, and the first gate via hole, the second gate via hole and the third gate via hole are provided in the gap region.

Other aspects may become clear after the accompanying drawings and the detailed description are read and understood.

BRIEF DESCRIPTION OF DRAWINGS

The accompanying drawings are intended to provide an understanding of technical schemes of the present disclosure and form a part of the specification, and are used to explain the technical schemes of the present application together with embodiments of the present disclosure, and not intended to form limitations to the technical schemes of the present disclosure. The shape and size of each component in the drawings do not reflect the true scale, and are only intended to schematically illustrate the contents of the present disclosure.

Figure 1:
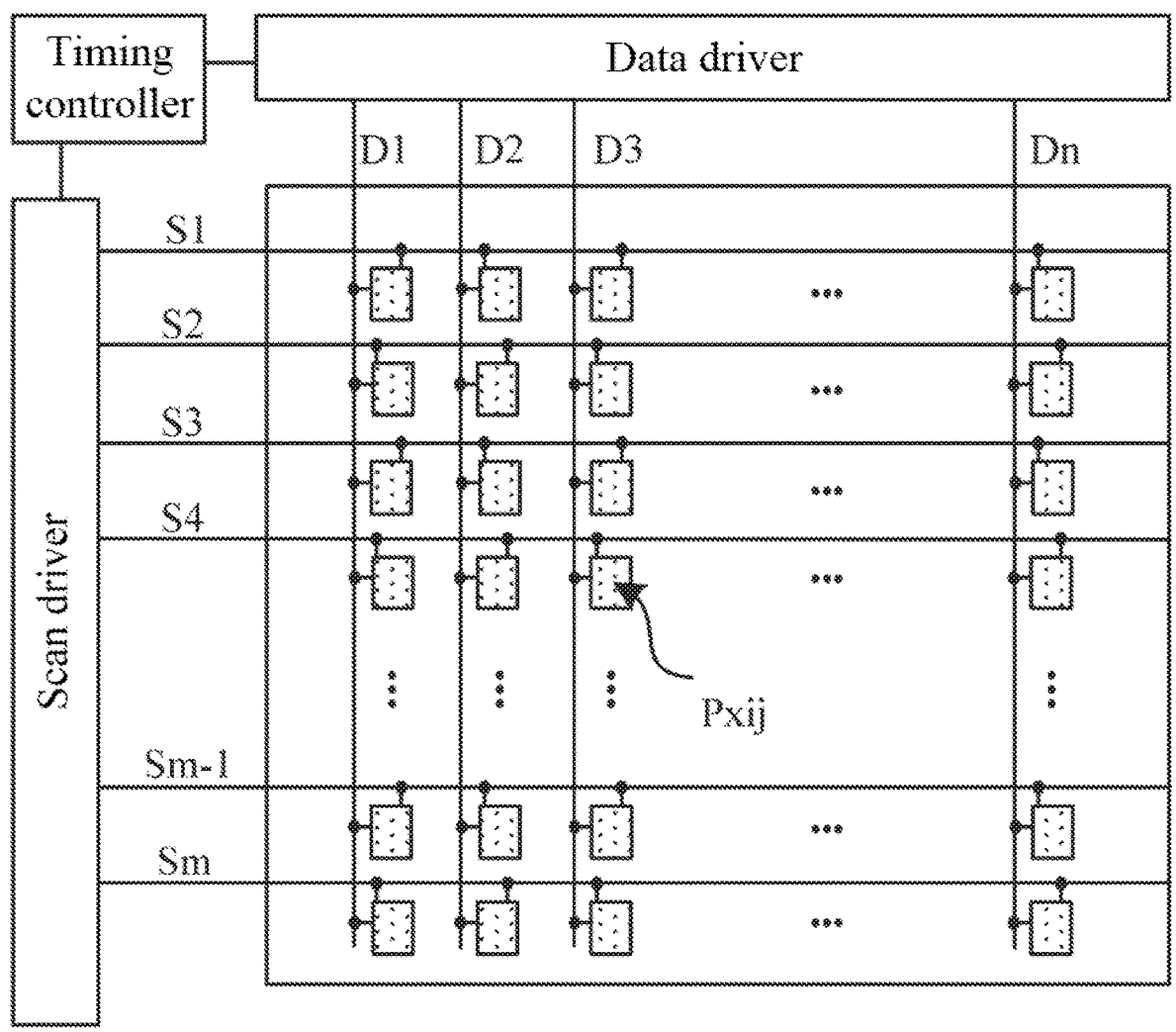
FIG. 1 is a schematic diagram of a structure of a display apparatus of a silicon-based OLED.

| Description of reference signs: | | |
|---|---|---|
| 1-first active layer; | 2-second active layer; | 3-third active layer; |
| 4-contact electrode; | 11-first gate electrode; | 11-1-first gate body portion; |
| 11-2-first gate connection portion; | 12-second gate electrode; | 12-1-second gate body portion; |
| 12-2-second gate connection portion; | 13-third gate electrode; | 13-1-third gate body portion; |
| 13-2-third gate connection portion; | 21-twenty-first connection electrode; | 22-twenty-second connection electrode; |
| 23-twenty-third connection | 24-twenty-fourth connection | 26-first scan signal line |
| 27-second scan signal line | 28-bias voltage line; | 29-bias connection line; |
| 31-thirty-first connection electrode; | 32-thirty-second connection electrode; | 33-thirty-third connection electrode; |
| 34-data signal line; | 35-reference signal line; | 41-forty-first connection electrode; |
| 42-forty-second connection electrode; | 43-light emitting voltage line; | 51-fifty-first connection electrode; |
| 52-fifty-secondconnection electrode; | 61-sixty-first connection electrode; | 71-anode connection electrode; |
| 72-power supply electrode; | 73-first power supply line; | 91-first plate; |
| 92-second plate; | 101-silicon base; | 102-driving circuit layer; |
| 103-light emitting structure layer; | 104-first encapsulation layer; | 105-color filter structure layer; |
| 106-second encapsulation layer; | 107-cover plate layer. | |

DETAILED DESCRIPTION

In order to make objects, technical schemes and advantages of the present disclosure more clear, embodiments of the present disclosure will be described below in detail in combination with the drawings. It should be noted that embodiments may be implemented in a number of different forms. Those of ordinary skills in the art may readily understand the fact that implementations and contents may be transformed into various forms without departing from the essence and scope of the present disclosure. Therefore, the present disclosure should not be interpreted as being limited to the contents recorded in following embodiments only. The embodiments in the present disclosure and features in the embodiments may be arbitrarily combined with each other without conflicts. In order to keep the following description of the embodiments of the present disclosure clear and concise, detailed descriptions of a portion of known functions and known components are omitted in the present disclosure. The drawings in the embodiments of the present disclosure relate only to the structures involved in the embodiments of the present disclosure, and conventional designs may be used as references for other structures.

Scales of the drawings in the present disclosure may be used as references in the actual processes, but are not limited thereto. For example, a width-to-length ratio of a channel, a thickness of each film layer and a spacing between two film layers, and a width of each signal line and a spacing between two signal lines may be adjusted according to actual needs. The number of pixels in a display apparatus and the number of sub-pixels in each pixel are not limited to the numbers shown in the drawings. The drawings described in the present disclosure are schematic structure diagrams only, and one implementation of the present disclosure is not limited to the shapes or numerical values shown in the drawings.

Ordinal numerals such as "first", "second", "third" and the like in the specification are set in order to avoid confusion of the constituent elements, but not set to make a limit in quantity.

For convenience, the terms such as "middle", "upper", "lower", "front", "back", "vertical", "horizontal", "top", "bottom", "inside", "outside" and the like indicating orientation or position relationships are used in the specification to illustrate position relationships between the constituent elements with reference to the drawings, and are intended to facilitate description of the specification and simplification of the description, but not to indicate or imply that the mentioned device or element must have a specific orientation or be constructed and operated in a specific orientation, therefore, they should not be understood as limitations to the present disclosure. The position relationships between the constituent elements are appropriately changed according to directions of the constituent elements described. Therefore, words and phrases used in the specification are not limited and appropriate substitutions may be made according to situations.

Unless otherwise specified and defined explicitly, the terms "install", "couple" and "connect" should be understood in a broad sense in the specification. For example, the connection may be a fixed connection, a detachable connection or an integrated connection, or may be a mechanical connection or an electrical connection, or may be a direct connection, an indirect connection through an intermediate component, or communication inside two components. The specific meanings of the above terms in the present disclosure may be understood by a person of ordinary skills in the art according to the specific situations.

In the specification, a transistor refers to a component which at least includes three terminals, that is, a gate electrode, a drain electrode and a source electrode. The transistor has a channel region between the drain electrode (drain electrode terminal, drain region or drain) and the source electrode (source electrode terminal, source region or source), and a current can flow through the drain electrode, the channel region and the source electrode. It should be noted that in the specification, the channel region refers to a region which a current flows mainly through.

In the specification, in order to distinguish between two electrodes of the transistor except the gate electrode, one of the two electrodes is directly referred to as a first electrode and the other is referred to as a second electrode. The first electrode may be a drain electrode and the second electrode may be a source electrode, or the first electrode may be a source electrode and the second electrode may be a drain electrode. In the case that transistors with opposite polarities are used or the case that a current direction is changed during circuit operation, functions of the "source electrode" and the "drain electrode" are sometimes interchangeable. Therefore, in the specification, the "source electrode" and the "drain electrode" may be interchangeable.

In the specification, "electrical connection" includes a case where the constituent elements are connected together through an element with a certain electrical effect. The "element with the certain electrical effect" is not particularly limited as long as electrical signals may be sent and received between the connected constituent elements. Examples of the "element with the certain electrical action" not only include an electrode and a wiring, but also include a switching element (such as a transistor), a resistor, an inductor, a capacitor, other elements with one or more functions, etc.

In the specification, "parallel" refers to a state in which an angle formed by two straight lines is −10° or greater than −10° and 100 or less than 10°, and thus also includes a state in which the angle is −5° or greater than −5° and 5° or less than 5°. In addition, "vertical" refers to a state in which an angle formed by two straight lines is 800 or greater than 800 and 1000 or less than 100°, and thus also includes a state in which the angle is 850 or greater than 850 and 950 or less than 95°.

In the specification, "film" and "layer" may be interchangeable. For example, sometimes "conductive layer" may be replaced by "conductive film". Similarly, sometimes "insulating film" may be replaced by "insulating layer".

"Being disposed on the same layer" mentioned in the specification means that two (or more than two) structures are formed by patterning through the same patterning process, and they may be made of the same or different materials. For example, materials of the precursors forming a plurality of structures disposed on the same layer are the same, and the resulting materials may be the same or different.

Triangle, rectangle, trapezoid, pentagon or hexagon in the specification are not in the strict sense, and they may be approximate triangle, rectangle, trapezoid, pentagon or hexagon, in which there may be some small deformations caused by tolerance, or there may be chamfers, arc edges and deformation, etc.

"About" in the present disclosure means that a boundary is defined loosely and numerical values in process and measurement error ranges are allowed.

FIG. 1 is a schematic diagram of a structure of a display apparatus of a silicon-based OLED. As shown in FIG. 1, the display apparatus of the silicon-based OLED may include a time sequence controller, a data signal driver, a scan signal driver and a pixel array. The pixel array may include a plurality of scan signal lines (S1 to Sm), a plurality of data signal lines (D1 to Dn) and a plurality of sub-pixels Pxij. In an exemplary embodiment, the time sequence controller may provide grayscale values and control signals suitable for the specification of the data signal driver to the data signal driver, and provide clock signals and scan start signals suitable for the specification of the scan signal driver to the scan signal driver. The data signal driver may generate data voltages to be provided to the data signal lines D1, D2, D3, . . . , and Dn using the grayscale values and the control signals that are received from the time sequence controller. For example, the data signal driver may sample the grayscale values using the clock signals and apply the data voltages corresponding to the grayscale values to the data signal lines D1 to Dn by taking a row of sub-pixels as a unit, wherein n may be a natural number. The scan signal driver may generate scan signals to be provided to the scan signal lines S1, S2, S3, . . . , and Sm by receiving the clock signals and the scan start signals from the time sequence controller. For example, the scan signal driver may sequentially provide scan signals with on-level pulses to the scan signal lines S1 to Sm. For example, the scan signal driver may be constructed in the form of a shift register and generate the scan signals by sequentially transmitting the scan start signals provided in the form of on-level pulses to a next-stage circuit under the control of the clock signal, wherein m may be a natural number. The sub-pixel array may include a plurality of sub-pixels PXij. Each sub-pixel PXij may be connected to a corresponding data signal line and a corresponding scan signal line, wherein i and j may be natural numbers. The sub-pixel Pxij may refer to a sub-pixel in which a transistor is connected to both the i-th scan signal line and the j-th data signal line.

Figure 2:
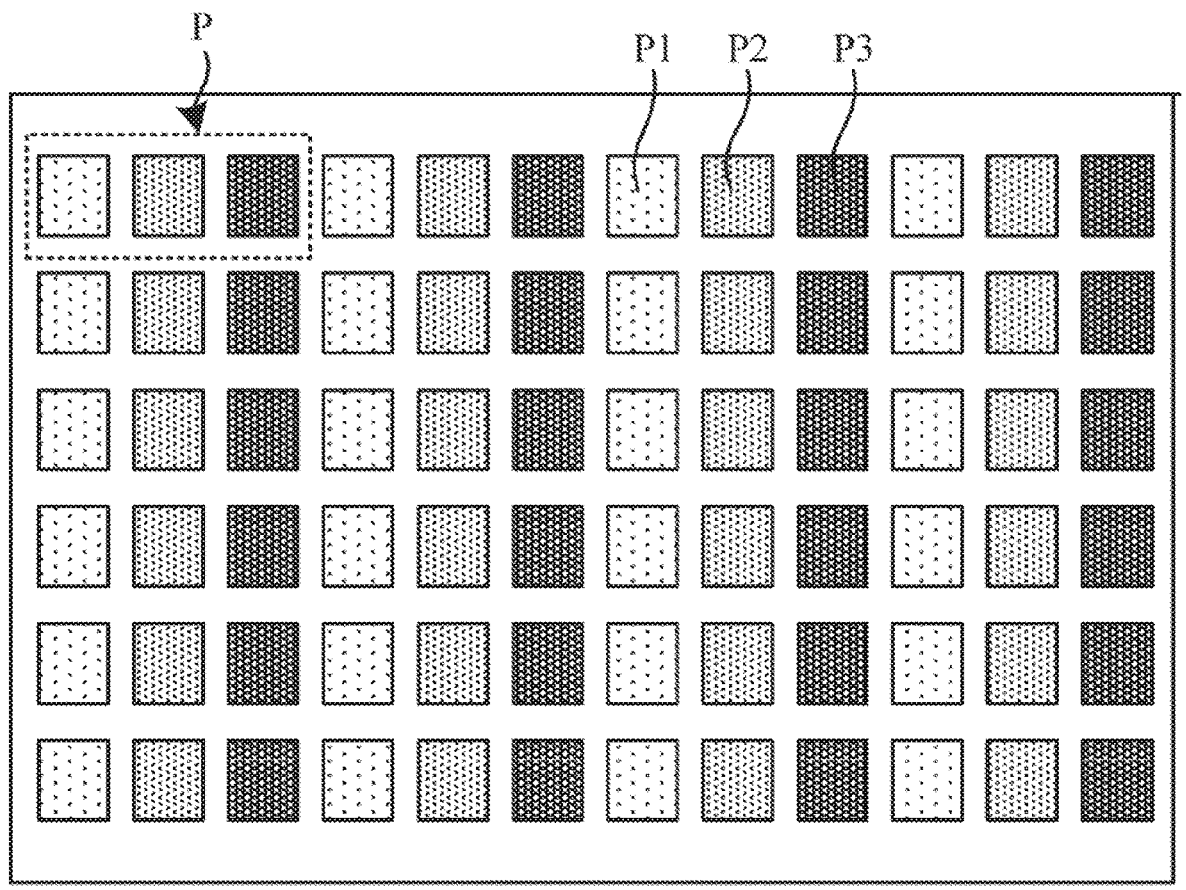
FIG. 2 is a schematic diagram of a planar structure of a display apparatus of a silicon-based OLED.

FIG. 2 is a schematic planar structure diagram of a display apparatus of a silicon-based OLED. As shown in FIG. 2, the display apparatus may include a plurality of pixel units P arranged in a matrix, at least one of the plurality of pixel units P includes a first sub-pixel P1 emitting light of a first color, a second sub-pixel P2 emitting light of a second color and a third sub-pixel P3 emitting light of a third color. The three sub-pixels each include a pixel driving circuit and a light emitting device. The pixel driving circuit in the sub-pixel is connected to the scan signal line and the data signal line, respectively. The pixel driving circuit is configured to receive the data voltage transmitted by the data signal line under the control of the scan signal line, and output a corresponding current to the display light emitting device. The display light emitting device in the sub-pixel is connected to the pixel driving circuit of the sub-pixel where the display light emitting device is located, and is configured to emit light with corresponding brightness in response to the current output by the pixel driving circuit of the sub-pixel where the display light-emitting device is located.

In an exemplary embodiment, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light.

In an exemplary embodiment, the sub-pixels may be in the shape of any one or more of a triangle, a square, a rectangle, a rhombus, a trapezoid, a parallelogram, a pentagon, a hexagon and other polygons. The three sub-pixels may be arranged side by side horizontally, side by side vertically or in a shape of the Chinese character "品", and the present disclosure is not limited thereto. In some other possible embodiments, the pixel unit may include four sub-pixels, and the present disclosure is not limited thereto.

Figure 3:
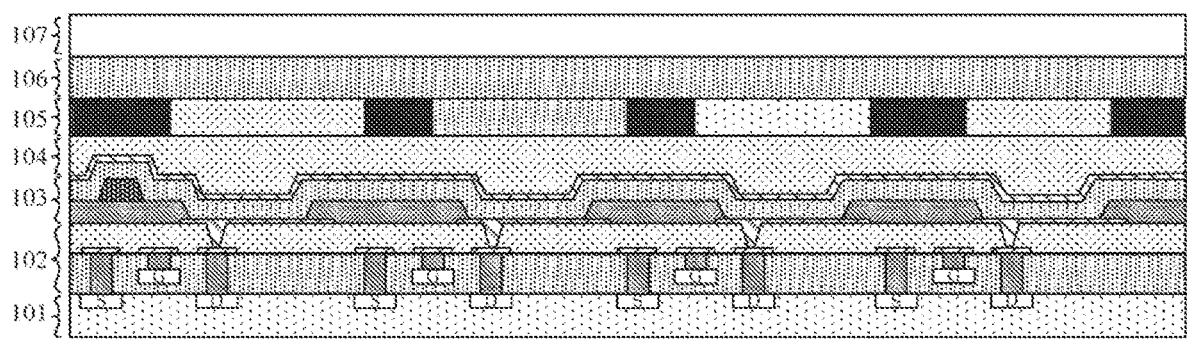
FIG. 3 is a schematic diagram of a section structure of a display apparatus of a silicon-based OLED.

FIG. 3 is a schematic section structure diagram of a display apparatus of a silicon-based OLED, which illustrates a structure in which full color is implemented in a manner of white light+color filter. As shown in FIG. 3, the display apparatus of the silicon-based OLED may include a silicon base 101, a driving circuit layer 102 disposed on the silicon base 101, a light emitting structure layer 103 disposed on one side of the driving circuit layer 102 away from the silicon base 101, a first encapsulation layer 104 disposed on one side of the light emitting structure layer 103 away from the silicon base 101, a color filter structure layer 105 disposed on one side of the first encapsulation layer 104 away from the silicon base 101, a second encapsulation layer 106 disposed on one side of the color filter structure layer 105 away from the silicon base 101, and a cover plate layer 107 disposed on one side of the second encapsulation layer 106 away from the silicon base 101. In some possible implementations, the display apparatus of the silicon-based OLED may include other film layers, and the present disclosure is not limited thereto.

In an exemplary embodiment, the silicon base 101 may be a bulk silicon base or a silicon-on-insulator (SOI) substrate. The driving circuit layer 102 may be fabricated on the silicon base 101 through a silicon semiconductor process (e.g., a CMOS process). The driving circuit layer 102 may include a plurality of circuit units, a circuit unit may at least include a pixel driving circuit connected to a scan signal line and a data signal line, respectively. The pixel driving circuit may include a plurality of transistor and a storage capacitor. One transistor is shown only in FIG. 3 as an example. The transistor may include a gate electrode G, a first electrode S and a second electrode D. The gate electrode G, the first electrode S and the second electrode D may be electrically connected respectively to the corresponding connection electrodes through via holes filled with wolfram metal (i.e., wolfram via, W-via), and may be connected to other electrical structures (e.g., traces) through the connection electrodes.

In an exemplary embodiment, the light emitting structure layer 103 may include a plurality of light emitting devices, and a light emitting device may at least include an anode, an organic light emitting layer and a cathode. The anode may be connected to the second electrode D of the transistor through a connection electrode, the organic light emitting layer is connected to the anode, the cathode is connected to the organic light emitting layer, and the cathode is connected to a second power supply line. The organic light emitting layer emits light under the driving of the anode and the cathode. In an exemplary embodiment, the organic light emitting layer may include an emitting layer (EML) and any one or more of a hole injection layer (HIL), a hole transport layer (HTL), an electron block layer (EBL), a hole block layer (HBL), an electron transport layer (ETL) and an electron injection layer (EIL). In an exemplary embodiment, for a light emitting device emitting white light, the organic light emitting layers of all sub-pixels may be connected together to form a common layer.

In an exemplary embodiment, the first encapsulation layer 104 and the second encapsulation layer 106 may adopt a manner of thin film encapsulation (TFE), so as to ensure that external water vapor cannot enter the light emitting structure layer. The cover plate layer 107 may be made of glass, or plastic colorless polyimide having flexible characteristics, or the like.

In an exemplary embodiment, the color filter structure layer 105 may include a black matrix (BM) and color filters (CFs). The color filters are provided in red (R) sub-pixels, green (G) sub-pixels and blue (B) sub-pixels respectively, and filter white light emitted by the light emitting devices into red (R) light, green (G) light and blue (B) light. The black matrix may be located between adjacent color filters.

At present, the display apparatus of the silicon-based OLED is gradually applied in the field of virtual reality (VR) or augmented reality (AR) near-eye display to enable users to experience real feelings in the virtual reality world, and has a super strong simulation system to implement human-computer interaction. Research has shown that when the screen resolution is large enough, the human retina cannot distinguish pixel points. Pixels Per Inch (PPI), which refers to the number of pixels per unit area, can be called pixel density. The higher the value of PPI, the higher the density at which the display substrate can display a picture, and the richer the details of the picture. Therefore, in order to improve the display quality, improving the PPI greatly has become the research emphasis of various manufacturers.

An exemplary example of the present disclosure provides a display substrate including a display substrate including a display area and a border area. The display area includes a plurality of sub-pixels forming a plurality of pixel rows and a plurality of pixel columns, and a sub-pixel includes a first region, a gap region and a second region arranged in sequence along a pixel row direction. At least one sub-pixel includes a pixel driving circuit, a first scan signal line and a second scan signal line. The pixel driving circuit at least includes a first transistor, a second transistor and a third transistor. The first scan signal line is configured to control turning-on or turning-off of the first transistor, and the second scan signal line is configured to control turning-on or turning-off of the second transistor. The first transistor at least includes a first gate electrode, a first active layer, a first electrode and a second electrode. The second transistor at least includes a second gate electrode and a second active layer. The third transistor at least includes a third gate electrode and a third active layer. The first active layer is disposed in the first region, the second active layer and the third active layer are disposed in the second region, and the second active layer is disposed at one side of the third active layer in a pixel column direction. The first scan signal line is connected to the first gate electrode through a first gate via hole, the second electrode of the first transistor is connected to the second gate electrode through a second gate via hole, the second scan signal line is connected to the third gate electrode through a third gate via hole, and the first gate via hole, the second gate via hole and the third gate via hole are provided in the gap region.

In an exemplary embodiment, along the pixel row direction, the first region has a first width, the second region has a second width, and the gap region has a third width, the third width is less than or equal to 0.5*the first width, and the third width is less than or equal to 0.5*the second width.

In an exemplary embodiment, the first gate electrodes of two adjacent sub-pixels in a pixel row are connected to each other to form an integrated structure, and the third gate electrodes of the two adjacent sub-pixels in the pixel row are connected to each other to form an integrated structure.

In an exemplary embodiment, the first gate electrodes of the integrated structure are connected to the first scan signal line through two first gate via holes, and the third gate electrodes of the integrated structure are connected to the second scan signal line through two third gate via holes.

In an exemplary embodiment, the first transistors, the second transistors and the third transistors of the two adjacent sub-pixels in the pixel row are mirror symmetrical with respect to a pixel centerline, which is a straight line located between the two adjacent sub-pixels in the pixel row and extending along the pixel column direction.

In an exemplary embodiment, the second transistor further includes a first electrode and a second electrode of the second transistor, and the third transistor further includes a first electrode and a second electrode of the third transistor, the first electrode of the first transistor is connected to a data signal line, the first electrode of the second transistor is connected to a light emitting voltage line, the first electrode of the third transistor is connected to a reference signal line, and the second electrode of the second transistor and the second electrode of the third transistor is connected to each other to form an integrated structure.

An exemplary embodiment of the present disclosure provides a display substrate with ultra-high PPI, in which minimum designs such as lapping positions of gate electrodes all arranged in the same gap region, sharing of gate electrodes, sharing of drain electrodes, overturning of sub-pixels, etc., are used, to maximize the PPI of the display substrate and implement the highest PPI design of Real RGB silicon-based OLED in the industry.

The technical schemes of the display substrate in accordance with the present disclosure will be described below through exemplary embodiments.

Figure 4:
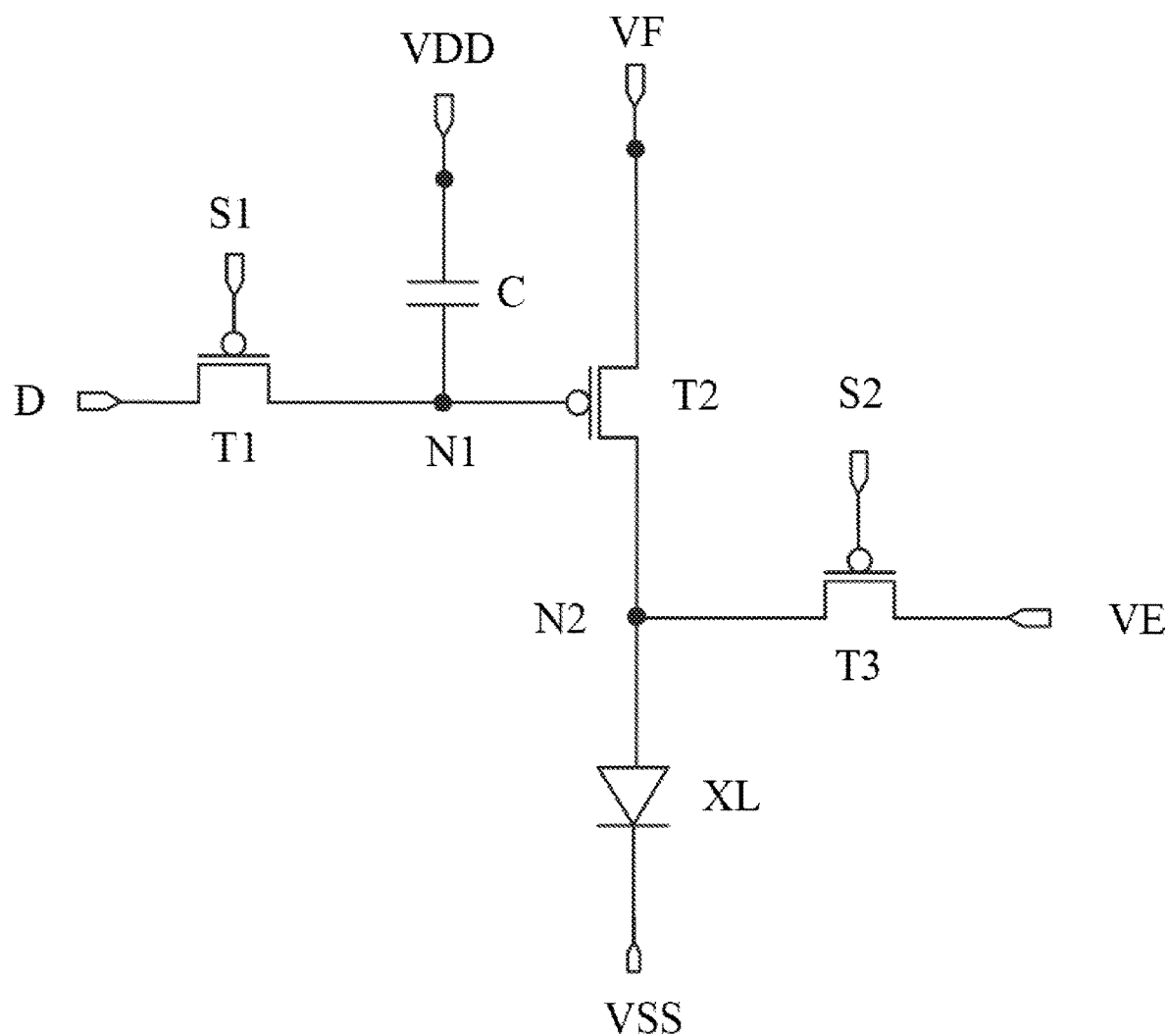
FIG. 4 is an equivalent circuit diagram of a pixel driving circuit in accordance with an exemplary embodiment of the present disclosure.

FIG. 4 is an equivalent circuit diagram of a pixel driving circuit in accordance with an exemplary embodiment of the present disclosure. In an exemplary embodiment, the pixel driving circuit may be a structure of 3T1C, 4T1C, 5T1C, 5T2C, 6T1C or 7T1C. As shown in FIG. 4, the pixel driving circuit in accordance with the exemplary embodiment of the present disclosure may be a structure of 3T1C, which includes three transistors (a first transistor T1, a second transistor T2 and a third transistor T3) and one storage capacitor C. The pixel driving circuit is connected to seven signal lines (a first scan signal line S1, a second scan signal line S2, a data signal line D, a reference signal line VE, a first power supply line VDD and a light emitting voltage line VF). A first node N1 and a second node N2 are points where the related electrical connections in the circuit diagram are jointed.

In an exemplary embodiment, a first terminal of the storage capacitor C may be connected to the first node N1, and a second terminal of the storage capacitor C may be connected to the first power supply line VDD.

In an exemplary embodiment, a gate electrode of the first transistor T1 is connected to the scan signal line S, a first electrode of the first transistor T1 is connected to the data signal line D, and a second electrode of the first transistor T1 is connected to the first node N1.

In an exemplary embodiment, a gate electrode of the second transistor T2 is connected to the first node N1, a first electrode of the second transistor T2 is connected to the light emitting voltage line VF, and a second electrode of the second transistor T2 is connected to the second node N2.

In an exemplary embodiment, a gate electrode of the third transistor T3 is connected to the second scan signal line S2, a first electrode of the third transistor T3 is connected to the reference signal line VE, and a second electrode of the third transistor T3 is connected to the second node N2.

In an exemplary embodiment, a first electrode of the light emitting device XL is connected to the second node N2, and a second electrode of the light emitting device XL is connected to a second power supply line VSS.

In an exemplary embodiment, the first transistor T1 is configured to, under the control of a signal of the first scan signal line S, receive a data voltage transmitted by the data signal line D, store the data voltage into the storage capacitor C, and provide the data voltage to the gate electrode of the second transistor T2. The second transistor T2 is configured to, under the control of the data signal received by its gate electrode, generate a corresponding current at its second electrode to drive the display light emitting device XL to emit light. The third transistor T3 is configured to, under the control of a signal of the second scan signal line S2, receive a reference voltage transmitted by the reference signal line VE and provide the reference voltage to the second node N2. The storage capacitor C is configured to store the potential of the gate electrode of the second transistor T2. The light emitting device XL is configured to emit light with corresponding brightness in response to the current of the second electrode of the second transistor T2.

In an exemplary embodiment, signals of the first power supply line VDD may be high-level signals continuously provided, signals of the light emitting voltage line VF may be voltage signals output by the light emitting control transistor, and signals of the second power supply line VSS may be low-level signals continuously provided.

In an exemplary embodiment, the first transistor T1, the second transistor T2 and the third transistor T3 may be P-type transistors. In another exemplary embodiment, the first transistor T1, the second transistor T2 and the third transistor T3 may be N-type transistors. Use of the same type of transistors in the pixel driving circuit may simplify a process flow, reduce the process difficulty of a display panel, and improve the product yield. In yet another exemplary embodiment, the first transistor T1, the second transistor T2 and the third transistor T3 may include the P-type transistor and the N-type transistor. For example, the first transistor T1 and the second transistor T2 may be P-type metal oxide semiconductor (PMOS) transistors, and the third transistor T3 may be an N-type metal oxide semiconductor (NMOS) transistor.

In an exemplary embodiment, the light emitting device XL may be an organic light emitting diode (OLED) including a first electrode (anode), an organic light emitting layer and a second electrode (cathode) that are stacked.

Figure 5:
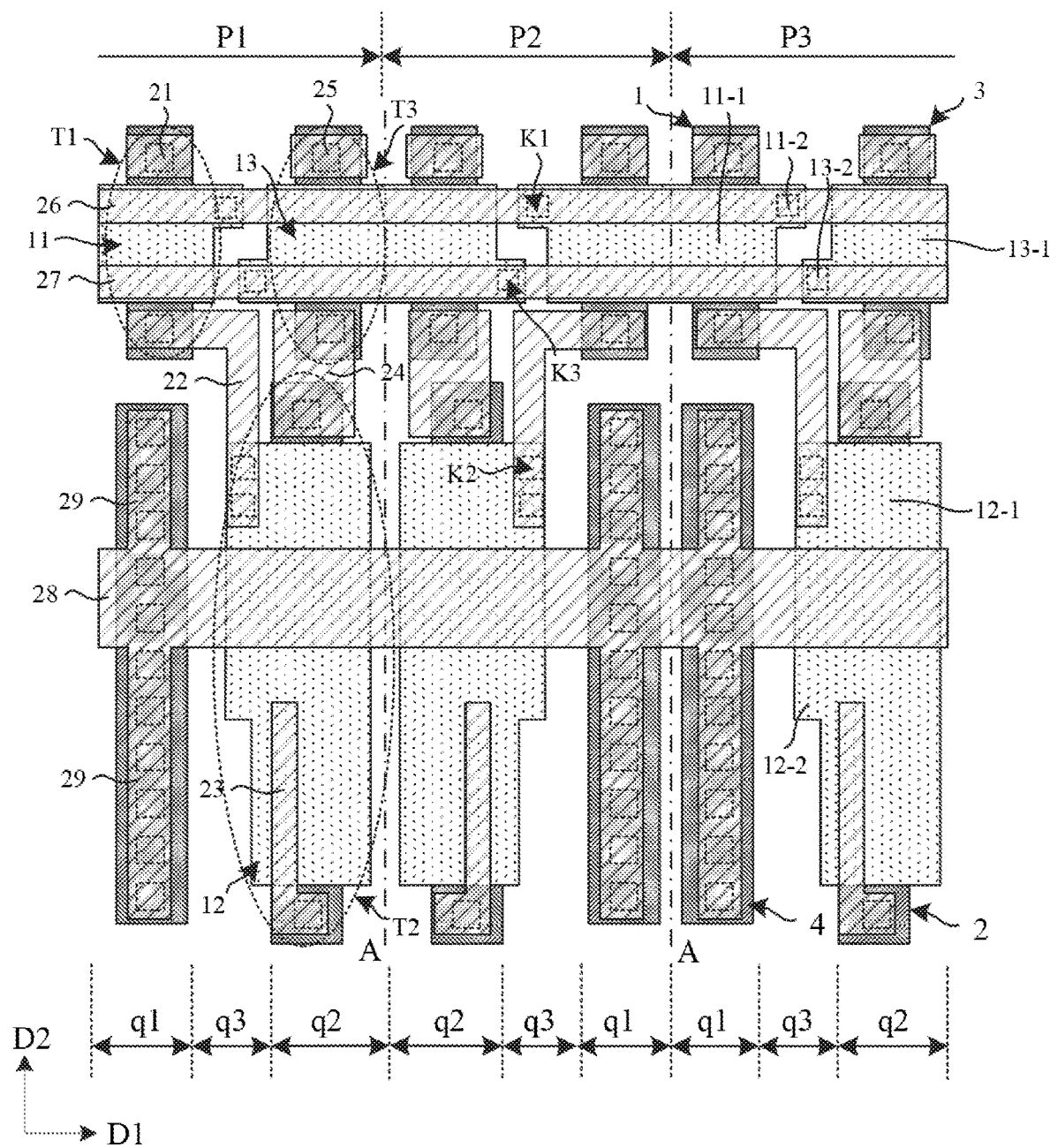
FIG. 5 is a schematic diagram of a planar structure of a display substrate in accordance with an exemplary embodiment of the present disclosure.

FIG. 5 is a schematic planar structure diagram of a display substrate in accordance with an exemplary embodiment of the present disclosure, which illustrates a structure in which there are three sub-pixels in one pixel unit. In an exemplary embodiment, in a plane perpendicular to the display substrate, the display substrate may at least include a silicon base, a driving circuit layer disposed on the silicon base, a light emitting structure layer disposed on one side of the driving circuit layer away from the silicon base, and an encapsulation layer disposed on one side of the light emitting structure layer away from the silicon base. In a plane parallel to the display substrate, the driving circuit layer of the display substrate may include a plurality of sub-pixels forming a plurality of pixel rows and a plurality of pixel columns. A first sub-pixel P1, a second sub-pixel P2 and a third sub-pixel P3 arranged in sequence along a first direction D1 form a pixel unit. The first sub-pixel P1, the second sub-pixel P2 and the third sub-pixel P3 each include a pixel driving circuit, a first scan signal line 26 and a second scan signal line 27. The pixel driving circuit may at least include a first transistor T1, a second transistor T2 and a third transistor T3. The first scan signal line 26 is configured to control turning-on or turning-off of the first transistor T1, and the second scan signal line 27 is configured to control turning-on or turning-off of the second transistor T2.

As shown in FIG. 5, in an exemplary embodiment, the first transistor T1 may include a first active layer 1, a first gate electrode 11, a first electrode (twenty-first connection electrode) 21 of the first transistor T1 and a second electrode (twenty-second connection electrode) 22 of the first transistor T1. The second transistor T2 may include a second active layer 2, a second gate electrode 12, a first electrode (twenty-third connecting electrode) 23 of the second transistor T2 and a second electrode (twenty-fourth connecting electrode) 24 of the second transistor T2. The third transistor T3 may include a third active layer 3, a third gate electrode 13, a first electrode (twenty-fifth connecting electrode) 25 of the third transistor T3 and a second electrode (twenty-fourth connecting electrode) 24 of the third transistor T3.

In an exemplary embodiment, the first sub-pixel P1, the second sub-pixel P2 and the third sub-pixel P3 each may include a first region q1, a gap region q3 and a second region q2 that are arranged in sequence along the pixel row direction. The gap region q3 may be disposed between the first region q1 and the second region q2. For example, the first sub-pixel P1 and the third sub-pixel P3 each may include a first region q1, a gap region q3 and a second region q2 arranged in sequence along the first direction D1, and the second sub-pixel P2 may include a first region q1, a gap region q3 and a second region q2 arranged in sequence along the opposite direction of the first direction D1. Positions of the three regions of the first sub-pixel P1 and the three regions of the second sub-pixel P2 are configured to be mirror symmetrical with respect to a pixel centerline A, and positions of the three regions of the second sub-pixel P2 and the three regions of the third sub-pixel P3 are configured to be mirror symmetrical with respect to the pixel centerline A. The pixel centerline A is a straight line located between two adjacent sub-pixels in the first direction D1 and extending along a second direction D2.

In an exemplary embodiment, along the first direction D1, the first region q1 may have a first width, the second region q2 may have a second width, and the gap region q3 may have a third width. The third width may be less than or equal to 0.5*the first width, and the third width may be less than or equal to 0.5*the second width.

In an exemplary embodiment, in at least one sub-pixel, the first active layer 1 may be disposed in the first region q1, the second active layer 2 and the third active layer 3 may be disposed in the second region q2, the second active layer 2 may be disposed at one side of the third active layer 3 in the second direction D2, and there is no active layer disposed in the gap region q3, which serves as a spacing region between the active layer in the first region q1 and the active layer in the second region q2. Thus, the first transistor T1, the second transistor T2 and the third transistor T3 arranged in the shape of a letter "L" are formed. The first transistor T1 and the third transistor T3 may be arranged in sequence along the first direction D1, and the second transistor T2 and the third transistor T3 may be arranged in sequence along the second direction D2.

In an exemplary embodiment, in the at least one sub-pixel, the first scan signal line 26 is connected to the first gate electrode 11 of the first transistor T1 through a first gate via hole K1, the second electrode 22 of the first transistor is connected to the second gate electrode 12 of the second transistor T2 through a second gate via hole K2, and the second scan signal line 27 is connected to the third gate electrode of the third transistor T3 through a third gate via hole K3. The first gate via hole K1, the second gate via hole K2 and the third gate via hole K3 may all be provided in the gap region q3 to form a structure in which the lapping positions of the gate electrodes in the sub-pixel are all located in the same gap region.

In an exemplary embodiment, the first electrode 21 of the first transistor T1 may be connected to the data signal line, the first electrode 23 of the second transistor T2 may be connected to the light emitting voltage line, and the first electrode 25 of the third transistor T3 may be connected to the reference signal line. The second electrode 24 of the second transistor T2 and the second electrode 24 of the third transistor T3 may be disposed on the same layer and connected to each other to form an integrated structure through the same patterning process, to form a structure in which the drain electrodes in the sub-pixel are shared.

In an exemplary embodiment, the first transistors T1, the second transistors T2 and the third transistors T3 of two adjacent sub-pixels in the first direction D1 may be mirror symmetrical with respect to the pixel centerline A, to form a structure in which the sub-pixels are horizontally turned over with respect to the pixel centerline A.

In an exemplary embodiment, the first gate electrodes 11 of two adjacent sub-pixels in the first direction D1 may be disposed on the same layer and connected to each other to form an integrated structure through the same patterning process, and the third gate electrodes 13 of the two adjacent sub-pixels in the first direction D1 may be disposed on the same layer and connected to each other to form an integrated structure through the same patterning process, to form a structure in which the gate electrodes of the adjacent sub-pixels are shared. For example, the third gate electrode 13 of the first sub-pixel P1 and the third gate electrode 13 of the second sub-pixel P2 are connected to each other to form an integrated structure, and the first gate electrode 11 of the second sub-pixel P2 and the first gate electrode 11 of the third sub-pixel P3 are connected to each other to form an integrated structure.

In an exemplary embodiment, in the at least one sub-pixel, the first gate electrode 11 of the first transistor T1 may include a first gate body portion 11-1 and a first gate connection portion 11-2. The first gate connection portion 11-2 may be disposed at one side of the first gate body portion 11-1 close to the third transistor T3 and connected to the first gate body portion 11-1, such that the first gate connection portion 11-2 is located in the gap region q3. The first scan signal line 26 may be connected to the first gate connection portion 11-2 through the first gate via hole K1.

In an exemplary embodiment, in the at least one sub-pixel, the second gate electrode 12 of the second transistor T2 may include a second gate body portion 12-1 and a second gate connection portion 12-2. The second gate connection portion 12-2 may be disposed at one side of the second gate body portion 12-1 close to the first transistor T1 and connected to the second gate body portion 12-1, such that the second gate connection portion 12-2 is located in the gap region q3. The second electrode 22 of the first transistor is connected to the second gate connection portion 12-2 through the second gate via hole K2.

In an exemplary embodiment, in the at least one sub-pixel, the third gate electrode 13 of the third transistor T3 may include a third gate body portion 13-1 and a third gate connection portion 13-2. The third gate connection portion 13-2 may be disposed at one side of the third gate body portion 13-1 close to the first transistor T1 and connected to the third gate body portion 13-1, such that the third gate connection portion 13-2 is located in the gap region q3. The second scan signal line 27 may be connected to the third gate connection portion 13-2 through the third gate via hole K3.

In an exemplary embodiment, in the at least one sub-pixel, the first gate connection portion 11-2 and the third gate connection portion 13-2 are interlaced in the second direction D2, and are spaced apart from each other.

In an exemplary embodiment, edges of the first gate body portion 11-1 and the first gate connection portion 11-2 away from the second transistor T2 may be flush.

In an exemplary embodiment, edges of the third gate body portion 13-1 and the third gate connection portion 13-2 close to the second transistor T2 may be flush.

In an exemplary embodiment, main parts of the first scan signal line 26 and the second scan signal line 27 may be in a shape of a line extending along the first direction D1. An orthographic projection of the first scan signal line 26 on a plane of the display substrate overlaps at least partially with orthographic projections of the first gate electrode 11 and the third gate electrode 13 on the plane of the display substrate, and an orthographic projection of the second scan signal line 27 on the plane of the display substrate overlaps at least partially with the orthographic projections of the first gate electrode 11 and the third gate electrode 13 on the plane of the display substrate.

In an exemplary embodiment, the at least one sub-pixel may further include a contact electrode 4, which may be disposed in the first region q1. The contact electrode 4 may be disposed at one side of the first active layer 1 in the second direction D2. The contact electrode 4 is configured to perform low-voltage bias on the silicon base, so as to avoid threshold voltage changes caused by bias effects such as parasitic effects of the silicon base, or the like, thereby improving the stability of the circuit.

In an exemplary embodiment, at least one sub-pixel may further include a bias voltage line 28. An orthographic projection of the bias voltage line 28 on the plane of the display substrate overlaps at least partially with an orthographic projection of the second gate electrode 12 of the second transistor on the plane of the display substrate. The bias voltage line 28 may be connected to the contact electrode 4 through a via hole to enable the bias voltage line 28 to provide a low voltage to the contact electrode 4.

In an exemplary embodiment, in the at least one sub-pixel, the main part of the contact electrode 4 may be in a shape of a line extending along the second direction D2, the main part of the bias voltage line is in a shape of a line extending along the first direction, a bias connection line 29 is disposed at one or both sides of the bias voltage line 28 in the second direction, and the main part of the connection line 29 is in a shape of a strip extending along the second direction. An orthographic projection of the bias connection line 29 on the plane of the display substrate overlaps at least partially with an orthographic projection of the contact electrode 4 on the plane of the display substrate, and the bias connection line 29 is connected to the contact electrode 4 through a plurality of via holes.

In an exemplary embodiment, the bias voltage line 28 and the bias connection line 29 may be disposed on the same layer and connected to each other to form an integrated structure through the same patterning process.

In an exemplary embodiment, in a plane perpendicular to the display substrate, the driving circuit layer of the display substrate may include a first conductive layer and a second conductive layer disposed in sequence on the silicon base. The silicon base may at least include the first active layer 1, the second active layer 2, the third active layer 3 and the contact electrode 4. The first conductive layer may at least include the first gate electrode 11, the second gate electrode 12 and the third gate electrode 13, and the second conductive layer may at least include the first electrode 21 of the first transistor T1, the second electrode 22 of the first transistor T1, the first electrode 23 of the second transistor T2, the second electrode (which is also the second electrode of the third transistor T3) 24 of the second transistor T2, the first electrode 25 of the third transistor T3, the first scan signal line 26, the second scan signal line 27, the bias voltage line 28 and the bias connection line 29.

In an exemplary embodiment, the driving circuit layer may further include a third conductive layer, a fourth conductive layer, a fifth conductive layer, a sixth conductive layer, a seventh conductive layer and an eighth conductive layer disposed on one side of the second conductive layer away from the silicon base. The third conductive layer may at least include the data signal line and the reference signal line, the fourth conductive layer may at least include the light emitting voltage line, the fifth conductive layer may at least include a plurality of connection electrodes, the sixth conductive layer may at least include a first plate of the storage capacitor, the seventh conductive layer may at least include a second plate of the storage capacitor, and the eighth conductive layer may at least include an anode connection electrode and the first power supply line.

A manufacturing process of the display apparatus will be described below by way of example. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. "Film" refers to a layer of film formed from a certain material on a substrate using deposition, coating or other processes. If the "film" does not need to be processed through a patterning process in the entire manufacturing process, the "film" may also be called a "layer". If the "film" needs to be processed through the patterning process in the entire manufacturing process, the "film" is called a "film" before the patterning process is performed and is called a "layer" after the patterning process is performed. At least one "pattern" is contained in the "layer" which has been processed through the patterning process. "A and B being disposed on the same layer" mentioned in the present disclosure means that A and B are formed simultaneously through the same the patterning process, and the "thickness" of the film layer is the dimension of the film layer in a direction perpendicular to the display apparatus. In the exemplary embodiment of the present disclosure, "an orthographic projection of B being within the range of an orthographic projection of A" or "an orthographic projection of A containing an orthographic projection of B" means that the boundary of the orthographic projection of B falls within the range of the boundary of the orthographic projection of A, or the boundary of the orthographic projection of A overlaps with the boundary of the orthographic projection of B.

In an exemplary embodiment, taking three sub-pixels in one pixel unit as an example, the manufacturing process of the display apparatus may include the following acts:

(1) A silicon base is formed. In an exemplary embodiment, forming the silicon base may include: providing the silicon base of a P-type silicon material, such as P-type monocrystalline silicon, which may serve as a channel region of an N-type transistor.

In an exemplary embodiment, the silicon base may be made of an N-type silicon material which serves as a channel region of a P-type transistor, and the present disclosure is not limited thereto.

Figure 6:
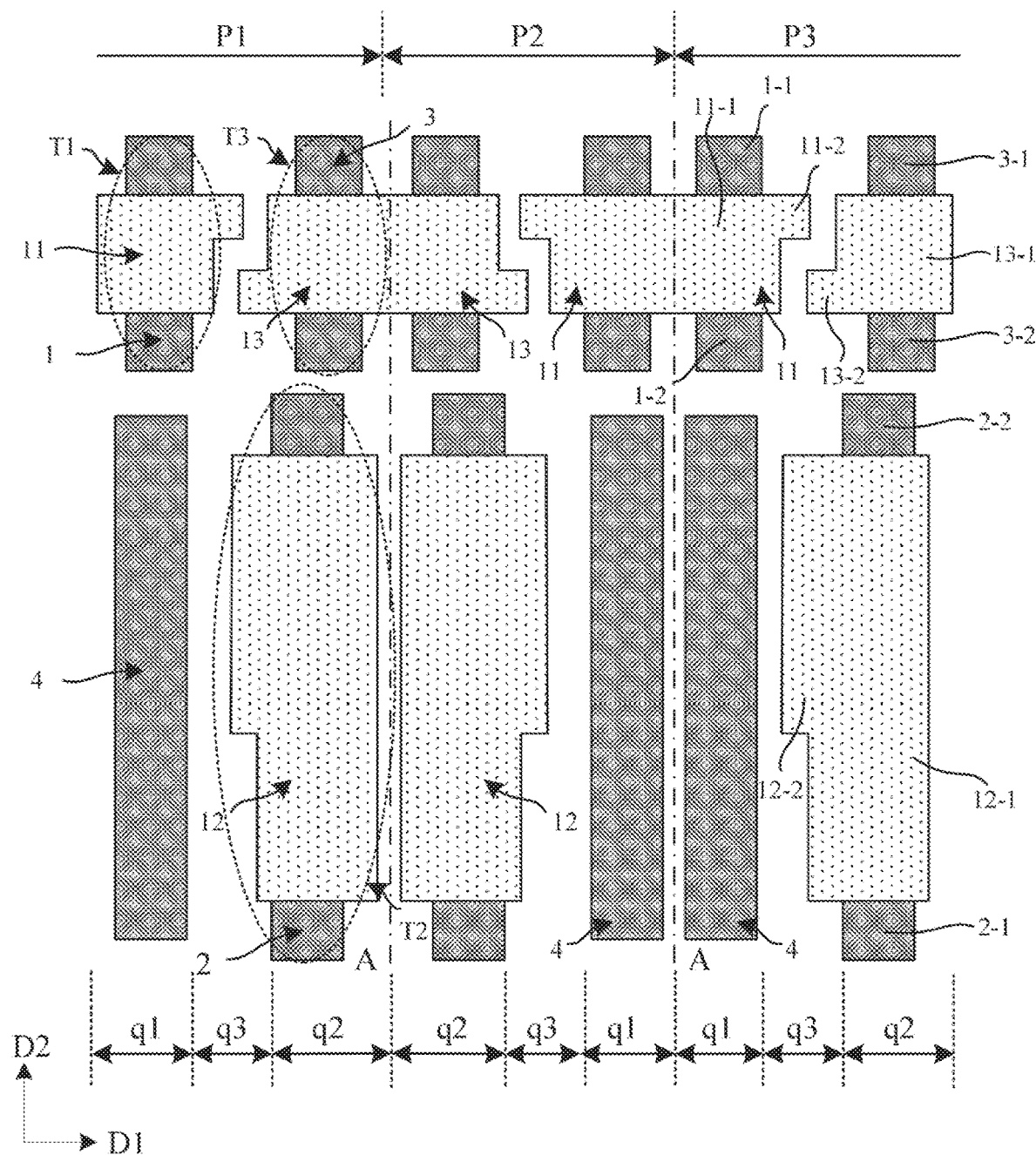
FIG. 6 is a schematic diagram of a display substrate after a pattern of a first conductive layer is formed in accordance with an embodiment of the present disclosure.

(2) A Pattern of a first conductive layer is formed. In an exemplary embodiment, forming the pattern of the first conductive layer may include: depositing a first insulation film and a polysilicon film in sequence on the silicon base, then patterning the polysilicon film through the patterning process to form a first insulation layer overlaying the silicon base and a pattern of a polysilicon layer disposed on the first insulation layer, and then performing a doping process by using the pattern of the polysilicon layer as a shield to form the pattern of the first conductive layer and pattern of active layers, as shown in FIG. 6.

In an exemplary embodiment, the doping process may adopt an N-type doping process, and the doped element may be a boron element. The formed pattern of the active layers may at least include the first active layer 1 of the first transistor T1, the second active layer 2 of the second transistor T2, the third active layer 3 of the third transistor T3 and the contact electrode 4, and the formed pattern of the first conductive layer may at least include the first gate electrode 11 of the first transistor T1, the second gate electrode 12 of the second transistor T2 and the third gate electrode 13 of the third transistor T3.

In an exemplary embodiment, the doping process may adopt an ion implantation process. Because the polysilicon layer is made of a semiconductor material, in the ion implantation process, on the one hand, the polysilicon layer may be used as a shield, such that ions are implanted into two sides of the polysilicon layer to form first regions and second regions of a plurality of transistors to implement self-alignment; on the other hand, the polysilicon layer may be doped at the same time, such that the polysilicon layer with higher resistance becomes the first conductive layer with lower resistance to form gate electrodes of the plurality of transistors. In the present disclosure, the process cost can be saved and the process difficulty can be decreased by using the polysilicon material as the first conductive layer.

In an exemplary embodiment, the first active layer 1 and the contact electrode 4 in each sub-pixel may be disposed in the first region q1, and the second active layer 2 and the third active layer 3 in each sub-pixel may be disposed in the second region q2, and there is no active layer disposed in the gap region q3, which serves as a spacing region between the active layer in the first region q1 and the active layer in the second region q2.

In an exemplary embodiment, the first active layer 1, the second active layer 2, the third active layer 3 and the contact electrode 4 may be in a shape of a strip extending along the second direction D2. The contact electrode 4 may be disposed at one side of the first active layer 1 in the second direction D2, and the second active layer 2 may be disposed at one side of the third active layer 3 in the second direction D2. Thus, the third active layer 3 may be disposed at one side of the first active layer 1 in the first direction D1 or at one side of the first active layer 1 in the opposite direction of the first direction D1. The second active layer 2 may be disposed at one side of the contact electrode 4 in the first direction D1 or at one side of the contact electrode 4 in the opposite direction of the first direction D1. The first active layer 1 and the third active layer 3 may be disposed at one side of the sub-pixel in the second direction D2, and the contact electrode 4 and the second active layer 2 may be disposed at the other side of the sub-pixel in the second direction D2. The first active layer 1, the second active layer 2 and the third active layer 3 in each sub-pixel form an "L" shaped layout. In the present disclosure, the second active layer 2 and the third active layer 3 are disposed at the same side of the sub-pixel in the first direction D1, which facilitates the connection between the second region of the second active layer 2 and the second region of the third active layer 3, not only can simplify the structure, but also can reduce the occupied area of the pixel driving circuit, thereby achieving the resolution of the display product.

In an exemplary embodiment, the patterns of the active layers of two adjacent sub-pixels in the first direction D1 may be mirror symmetrical with respect to a pixel centerline A, and the patterns of the active layers of two adjacent sub-pixels in the second direction D2 may be substantially the same. The pixel centerline A is a straight line located between the two adjacent sub-pixels in the first direction D1 and extending along the second direction D2. For example, the patterns of the active layers of the first sub-pixel P1 and the second sub-pixel P2 may be mirror symmetrical with respect to the pixel centerline A. As another example, the patterns of the active layers of the second sub-pixel P2 and the third sub-pixel P3 may be mirror symmetrical with respect to the pixel centerline A.

In an exemplary embodiment, the first gate electrode 11 and the third gate electrode 13 in each sub-pixel may be disposed in sequence along the first direction D1, and the second gate electrode 12 and the third gate electrode 13 may be disposed in sequence along the second direction D2, to form the "L" shaped layout in the sub-pixel.

In an exemplary embodiment, the patterns of the first conductive layers of two adjacent sub-pixels in the first direction D1 may be mirror symmetrical with respect to the pixel centerline A, and the patterns of the first conductive layers of two adjacent sub-pixels in the second direction D2 may be substantially the same. For example, the patterns of the first conductive layers of the first sub-pixel P1 and the second sub-pixel P2 may be mirror symmetrical with respect to the pixel centerline A. As another example, the patterns of the first conductive layers of the second sub-pixel P2 and the third sub-pixel P3 may be mirror symmetrical with respect to the pixel centerline A.

In an exemplary embodiment, due to the symmetrical characteristics of the patterns of the first conductive layers, the first gate electrodes 11 of the two adjacent sub-pixels in the first direction D1 may be connected to each other to form an integrated structure, and the third gate electrodes 13 of the two adjacent sub-pixels in the first direction D1 may be connected to each other to form an integrated structure. For example, the third gate electrodes 13 of the first sub-pixel P1 and the second sub-pixel P2 may be connected to each other to form an integrated structure. As another example, the first gate electrodes 11 of the second sub-pixel P2 and the third sub-pixel P3 may be connected to each other to form an integrated structure. In the present disclosure, the pixel driving circuits can be arranged more compactly on the premise of satisfying design rules by configuring the first gate electrodes of two adjacent sub-pixels to be connected to each other to form an integrated structure and configuring the third gate electrodes of the two adjacent sub-pixels to be connected to each other to form an integrated structure, to facilitate improvement of the resolution of the display apparatus.

In an exemplary embodiment, the first gate electrode 11 of the first transistor T1 may include the first gate body portion 11-1 and the first gate connection portion 11-2. The first gate body portion 11-1 may be in the shape of a rectangle. A region where the first gate body portion 11-1 overlaps with the first active layer 1 may serve as a first channel region of the first active layer 1. A first region 1-1 of the first active layer 1 may be located at one side of the first channel region in the second direction D2 (one side of the first channel region away from the contact electrode 4), and a second region 1-2 of the first active layer 1 may be located at one side of the first channel region in the opposite direction of the second direction D2 (one side of the first channel region close to the contact electrode 4). The first gate connection portion 11-2, which may be in the shape of a rectangle, may be disposed at one side of the first gate body portion 11-1 close to the third transistor T3 and connected to the first gate main portion 11-1, such that the first gate connection portion 11-2 is located in the gap region q3. The first gate connection portion 11-2 is configured to be connected to a first scan signal line formed Later through a first gate via hole.

In an exemplary embodiment, the second gate electrode 12 of the second transistor T2 may include the second gate body portion 12-1 and the second gate connection portion 12-2. The second gate body portion 12-1 may be in the shape of a rectangle. A region where the second gate body portion 12-1 overlaps with the second active layer 2 may serve as a second channel region of the second active layer 2. A first region 2-1 of the second active layer 2 may be located at one side of the second channel region in the opposite direction of the second direction D2 (one side of the second channel region away from the third active layer 3), and a second region 2-2 of the second active layer 2 may be located at one side of the second channel region in the second direction D2 (one side of the second channel region close to the third active layer 3). The second gate connection portion 12-2, which may be in the shape of a rectangle, may be disposed at one side of the second gate body portion 12-1 close to the contact electrode 4 and connected to the second gate body portion 12-1, such that the second gate connection portion 12-2 is located in the gap region q3. The second gate connection portion 12-2 is configured to be connected to a second electrode of a first transistor formed later through a second gate via hole.

In an exemplary embodiment, the third gate electrode 13 of the third transistor T3 may include the third gate body portion 13-1 and the third gate connection portion 13-2. The third gate body portion 13-1 may be in the shape of a rectangle. A region where the third gate body portion 13-1 overlaps with the third active layer 3 may serve as a third channel region of the third active layer 3. A first region 3-1 of the third active layer 3 may be located at one side of the third channel region in the second direction D2 (one side of the third channel region away from the second active layer 2), and a second region 3-2 of the third active layer 3 may be located at one side of the third channel region in the opposite direction of the second direction D2 (one side of the third channel region close to the second active layer 2). The third gate connection portion 13-2, which may be in the shape of a rectangle, may be disposed at one side of the third gate body portion 13-1 close to the first transistor T1 and connected to the third gate body portion 13-1, such that the third gate connection portion 13-2 is located in the gap region q3. The third gate connection portion 13-2 is configured to be connected to a second scan signal line formed later through a third gate via hole.

In an exemplary embodiment, because the first gate connection portion 11-2, the second gate connection portion 12-2 and the third gate connection portion 13-2 are all located in the gap region q3, and are respectively configured to be connected to the first scan signal line, the second electrode of the first transistor and the second scan signal line formed later, the lapping positions of the three gate electrodes are all located in the same gap region, which not only can make the pixel driving circuits be arranged more compactly on the premise of satisfying design rules to facilitate improvement of the resolution of the display apparatus, but also can make the gate via hole not affect the electrical performance of the transistors to improve the working reliability of the pixel driving circuits.

In an exemplary embodiment, the first gate connection portion 11-2 and the third gate connection portion 13-2 located in the gap region q3 may be interlaced in the second direction D2, and there is a gap between the first gate connection portion 11-2 and the third gate connection portion 13-2.

In an exemplary embodiment, the first gate connection portion 11-2 may be located at one end of the gap region q3 in the second direction D2, and the third gate connection portion 13-2 may be located at one end of the gap region q3 in the second direction D2. The edges of the first gate body portion 11-1 and the first gate connection portion 11-2 away from the second transistor T2 may be flush; the edges of the third gate body portion 13-1 and the third gate connection portion 13-2 close to the second transistor T2 may be flush. In some possible embodiments, the first gate connection portion 11-2 may be located at one end of the gap region q3 in the opposite direction of the second direction D2, and the third gate connection portion 13-2 may be located at one end of the gap region q3 in the second direction D2. The edges of the first gate body portion 11-1 and the first gate connection portion 11-2 close to the second transistor T2 may be flush, and the edges of the third gate body portion 13-1 and the third gate connection portion 13-2 away from the second transistor T2 may be flush.

In an exemplary embodiment, the contact electrode 4 may be an N-type doped region (N+). The contact electrode 4 is configured to perform low-voltage bias on the silicon base, so as to avoid threshold voltage changes caused by parasitic effects such as bias effects of the silicon base and improve the stability of the circuits. In the present disclosure, the contact electrode 4 is configured to perform low-voltage bias on the silicon base, so as to isolate electrically the devices between the sub-pixels and reduce parasitic effects between the devices, thereby improving the stability of the circuits.

Figure 7:
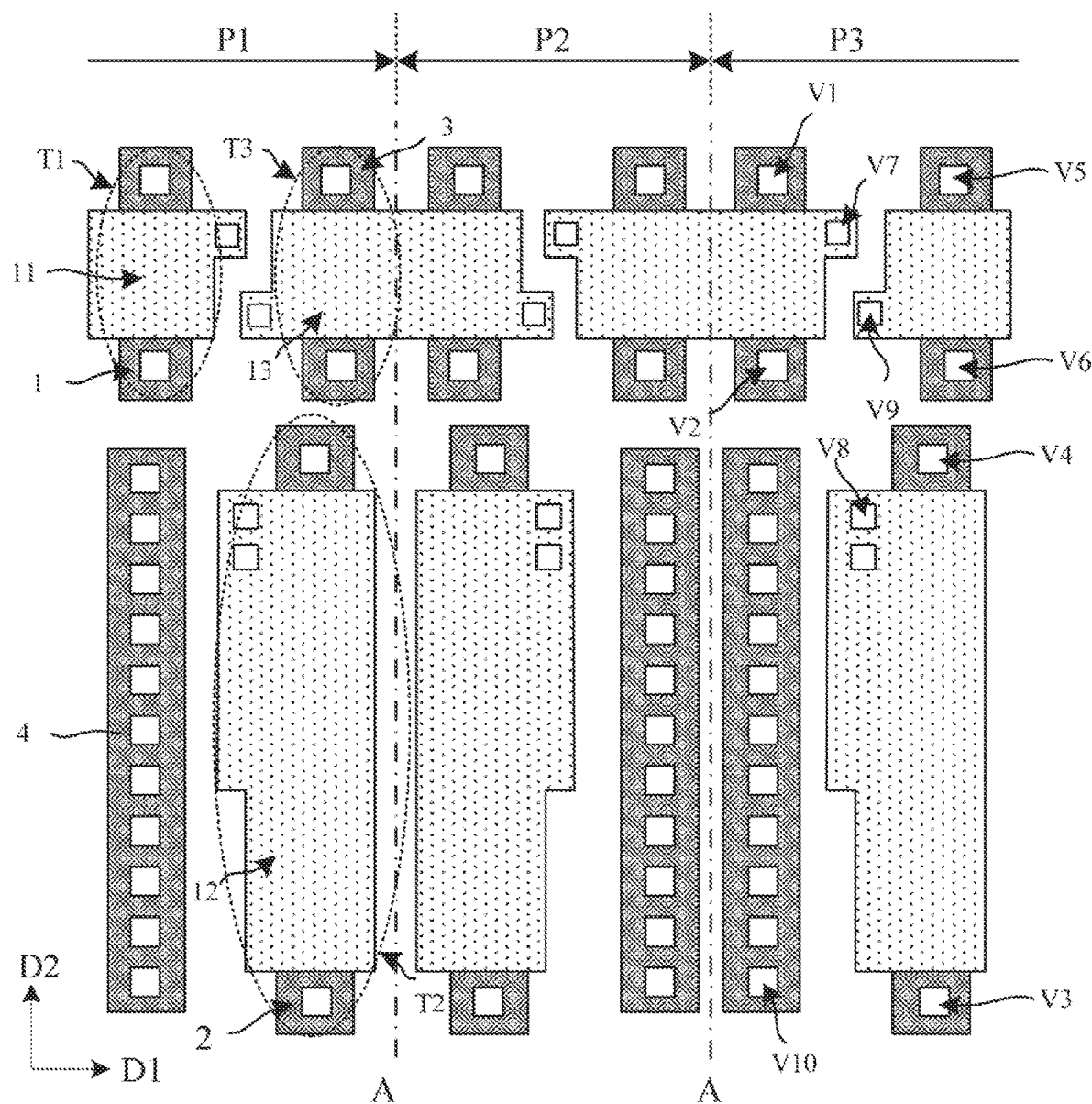
FIG. 7 is a schematic diagram of a display substrate after a pattern of a second insulation layer is formed in accordance with an embodiment of the present disclosure.

(3) A pattern of a second insulation layer is formed. In an exemplary embodiment, forming the pattern of the second insulation layer may include: depositing a second insulation film on the silicon base, on which the aforementioned patterns are formed, and patterning the second insulation film through the patterning process to form the second insulation layer overlaying the pattern of the first conductive layer. A plurality of via holes are provided in the second insulation layer, as shown in FIG. 7.

In an exemplary embodiment, the plurality of via holes in each sub-pixel may at least include a first via hole V1, a second via hole V2, a third via hole V3, a fourth via hole V4, a fifth via hole V5, a sixth via hole V6, a seventh via hole V7, an eighth via hole V8, a ninth via hole V9 and a tenth via hole V10.

In an exemplary embodiment, an orthographic projection of the first via hole V1 on the silicon base may be within the range of an orthographic projection of the first region of the first active layer 1 on the silicon base. The first insulation layer and the second insulation layer in the first via hole V1 are etched away to expose a surface of the first region of the first active layer 1. The first via hole V1 is configured to connect a twenty-first connection electrode formed later with the first region of the first active layer 1 through this via hole.

In an exemplary embodiment, an orthographic projection of the second via hole V2 on the silicon base is within the range of an orthographic projection of the second region of the first active layer 1 on the silicon base. The first insulation layer and the second insulation layer in the second via hole V2 are etched away to expose a surface of the second region of the first active layer 1. The second via hole V2 is configured to connect a twenty-second connection electrode formed later with the second region of the first active layer 1 through this via hole.

In an exemplary embodiment, an orthographic projection of the third via hole V3 on the silicon base is within the range of an orthographic projection of the first region of the second active layer 2 on the silicon base. The first insulation layer and the second insulation layer in the third via hole V3 are etched away to expose a surface of the first region of the second active layer 2. The third via hole V3 is configured to connect a twenty-third connection electrode formed later with the first region of the second active layer 2 through this via hole.

In an exemplary embodiment, an orthographic projection of the fourth via hole V4 on the silicon base is within the range of an orthographic projection of the second region of the second active layer 2 on the silicon base. The first insulation layer and the second insulation layer in the fourth via hole V4 are etched away to expose a surface of the second region of the second active layer 2. The fourth via hole V4 is configured to connect a twenty-fourth connection electrode formed later with the second region of the second active layer 2 through this via hole.

In an exemplary embodiment, an orthographic projection of the fifth via hole V5 on the silicon base is within the range of an orthographic projection of the first region of the third active layer 3 on the silicon base. The first insulation layer and the second insulation layer in the fifth via hole V5 are etched away to expose a surface of the first region of the third active layer 3. The fifth via hole V5 is configured to connect a twenty-fifth connection electrode formed later with the first region of the third active layer 3 through this via hole.

In an exemplary embodiment, an orthographic projection of the sixth via hole V6 on the silicon base is within the range of an orthographic projection of the second region of the third active layer 3 on the silicon base. The first insulation layer and the second insulation layer in the sixth via hole V6 are etched away to expose a surface of the second region of the third active layer 3. The sixth via hole V6 is configured to connect a twenty-fourth connection electrode formed later with the second region of the third active layer 3 through this via hole.

In an exemplary embodiment, an orthographic projection of the seventh via hole V7 on the silicon base is within the range of an orthographic projection of the first gate connection portion 11-2 of the first gate electrode 11 on the silicon base. The second insulation layer in the seventh via hole V7 is etched away to expose a surface of the first gate connection portion 11-2. The seventh via hole V7 is configured to connect a first scan signal line formed later with the first gate connection portion 11-2 through this via hole. The seventh via hole V7 may serve as the first gate via hole in the present disclosure.

In an exemplary embodiment, because the first gate electrodes 11 of two adjacent sub-pixels in the first direction D1 are connected to each other to form an integrated structure, two seventh via holes V7 (first gate via holes) are provided in a region where the first gate electrodes 11 of the integrated structure are located. The two seventh via holes V7 are respectively located at two ends of the first gate electrodes 11 of the integrated structure in the first direction D1, such that the first gate electrodes 11 of the same integrated structure may be connected to a first scan signal line formed later through the two seventh via holes V7.

In an exemplary embodiment, an orthographic projection of the eighth via hole V8 on the silicon base is within the range of an orthographic projection of the second gate connection portion 12-2 of the second gate electrode 12 on the silicon base. The second insulation layer in the eighth via hole V8 is etched away to expose a surface of the second gate connection portion 12-2. The eighth via hole V8 is configured to connect a twenty-second connection electrode formed later with the second gate connection portion 12-2 through this via hole. The eighth via hole V8 may serve as the second gate via hole in the present disclosure.

In an exemplary embodiment, an orthographic projection of the ninth via hole V9 on the silicon base is within the range of an orthographic projection of the third gate connection portion 13-2 of the third gate electrode 13 on the silicon base. The second insulation layer in the ninth via hole V9 is etched away to expose a surface of the third gate connection portion 13-2. The ninth via hole V9 is configured to connect a second scan signal line formed later with the third gate connection portion 13-2 through this via hole. The ninth via hole V9 may serve as the third gate via in the present disclosure.

In an exemplary embodiment, because the third gate electrodes 13 of two adjacent sub-pixels in the first direction D1 are connected to each other to form an integrated structure, two ninth via holes V9 (third gate via holes) are provided in a region where the third gate electrodes 13 of the integrated structure are located. The two ninth via holes V9 are respectively located at two ends of the third gate electrodes 13 of the integrated structure in the first direction D1, such that the third gate electrodes 13 of the same integrated structure may be connected to a second scan signal line formed later through the two ninth via holes V9.

In an exemplary embodiment, an orthographic projection of the tenth via hole V10 on the silicon base is within the range of an orthographic projection of the contact electrode 4 on the silicon base. The first insulation layer and the second insulation layer in the tenth via hole V10 are etched away to expose a surface of the contact electrode 4. The tenth via hole V10 is configured to connect a reference signal line formed later with the contact electrode 4 through this via hole.

In an exemplary embodiment, there may be a plurality of eight via holes V8 and a plurality of tenth via holes V10 to reduce the contact resistance and improve the connection reliability.

Figure 8A:
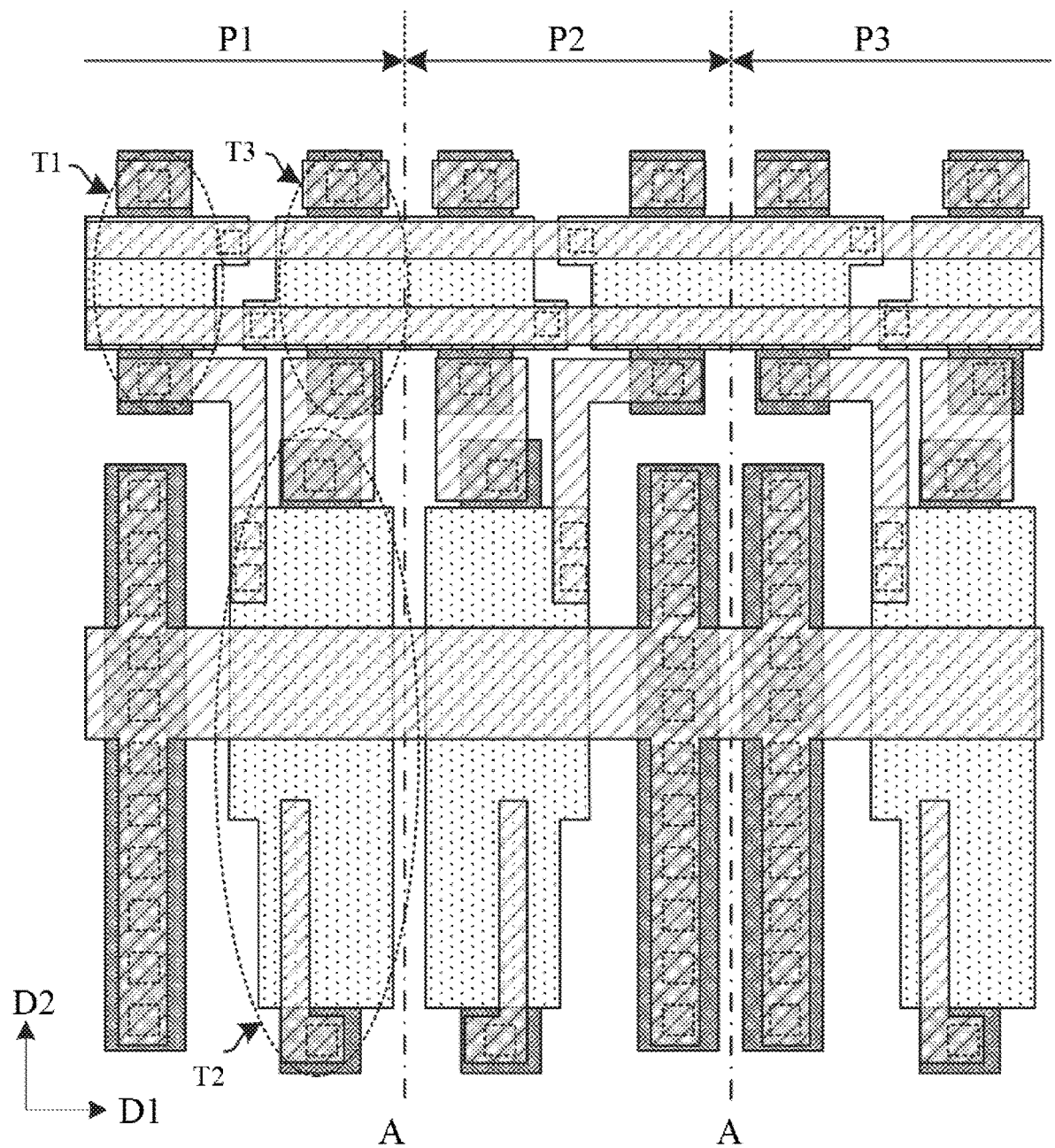
FIGS. 8A and 8B are schematic diagrams of a display substrate after the pattern of a second conductive layer is formed in accordance with an embodiment of the present disclosure.
Figure 8B:
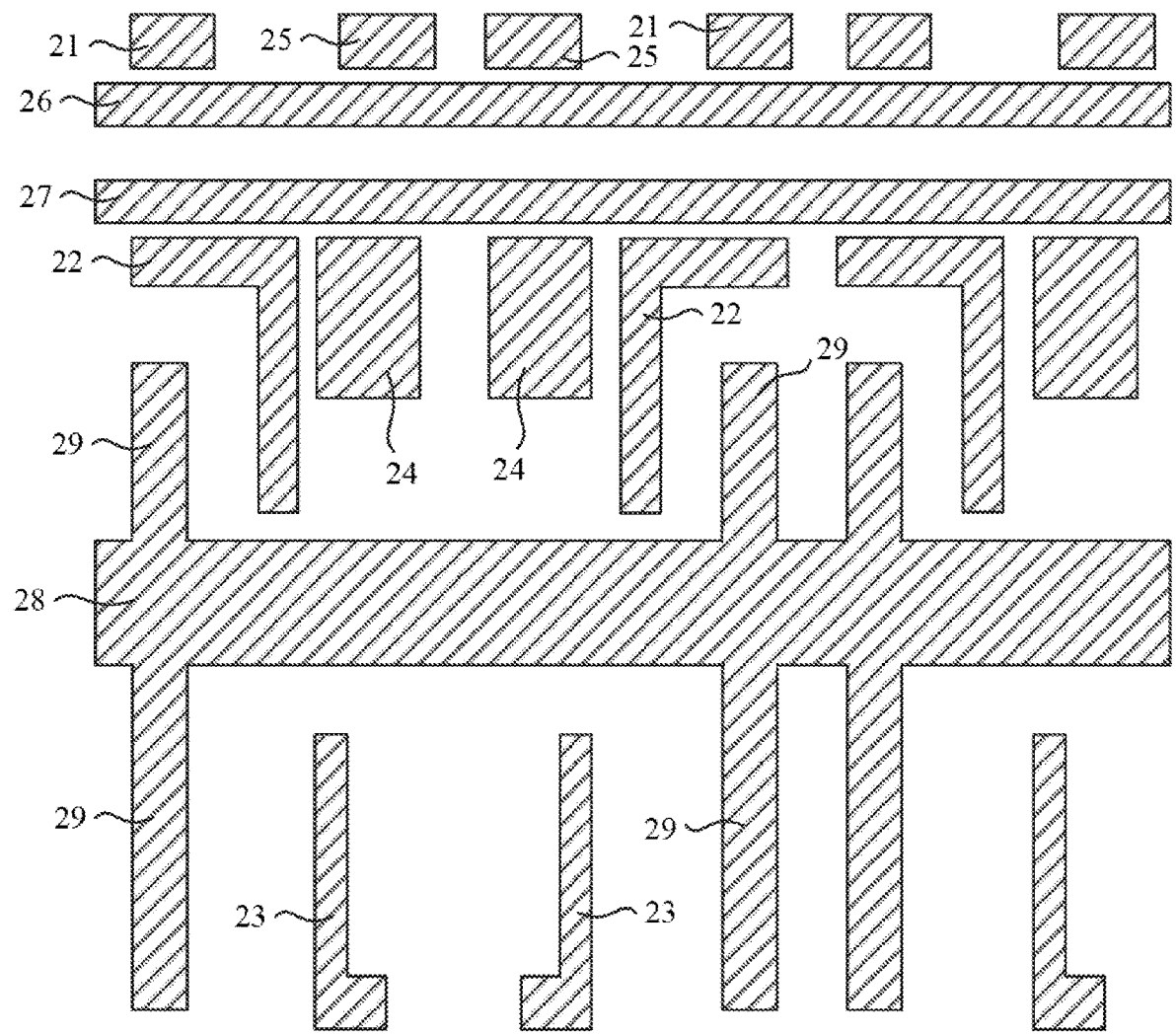

(4) A pattern of a second conductive layer is formed. In an exemplary embodiment, forming the pattern of the second conductive layer may include: depositing a second conductive film on the silicon base, on which the aforementioned patterns are formed, and patterning the second conductive film through the patterning process to form the pattern of the second conductive layer on the second insulation layer, as shown in FIGS. 8A and 8B. FIG. 8B is a schematic diagram of the second conductive layer in FIG. 8A. In an exemplary embodiment, the second conductive layer may be referred to as a first metal (Metal1) layer.

In an exemplary embodiment, the pattern of the second conductive layer may at least include a twenty-first connection electrode 21, a twenty-second connection electrode 22, a twenty-third connection electrode 23, a twenty-fourth connection electrode 24, a first scan signal line 26, a second scan signal line 27, a bias voltage line 28 and a bias connection line 29.

In an exemplary embodiment, the twenty-first connection electrode 21 may be in the shape of a rectangle. The twenty-first connection electrode 21 may be connected to the first region of the first active layer through the first via hole V1. The twenty-first connection electrode 21 may serve as the first electrode of the first transistor T1. The twenty-first connection electrode 21 is configured to be connected to a data signal line formed later.

In an exemplary embodiment, the twenty-second connection electrode 22 may be in the shape of the letter "L". A first end of the twenty-second connection electrode 202 may be connected to the second region of the first active layer through the second via hole V2, and a second end of the twenty-second connection electrode 22 may be connected to the second gate connection portion 12-2 of the second gate electrode 12 through the eighth via hole V8 after bending and extending towards a direction of the second gate electrode 12. The twenty-second connection electrode 22 may serve as the second electrode of the first transistor T1, to implement the connection between the second electrode of the first transistor T1 and the second gate electrode 12 of the second transistor T2.

In an exemplary embodiment, a main part of the twenty-third connection electrode 23 may be in the shape of a strip extending along the second direction D2. A first end of the twenty-third connection electrode 23 may be connected to the first region of the second active layer through the third via hole V3, and a second end of the twenty-third connection electrode 23 may extend to the middle position of the second gate electrode 12 along the second direction D2. The twenty-third connection electrode 23 may serve as the first electrode of the second transistor T2. The twenty-third connection electrode 23 is configured to be connected to a thirty-second connection electrode formed later.

In an exemplary embodiment, the twenty-fourth connection electrode 24 may be in the shape of a rectangle. A first end of the twenty-fourth connection electrode 24 may be connected to the second region of the second active layer 2 through the fourth via hole V4, and a second end of the twenty-fourth connection electrode 24 may be connected to the second region of the third active layer 3 through the sixth via hole V6. The twenty-fourth connection electrode 24 may serve as both the second electrode of the second transistor T2 and the second electrode of the third transistor T3, i.e., the second electrode of the second transistor T2 and the second electrode of the third transistor T3 are connected to each other to form an integrated structure. The twenty-fourth connection electrode 24 is configured to be connected to a thirty-third connection electrode formed later.

In an exemplary embodiment, the twenty-fifth connection electrode 25 may be in the shape of a rectangle. The twenty-fifth connection electrode 205 may be connected to the first region of the third active layer 3 through the fifth via hole V5. The twenty-fifth connection electrode 25 may serve as the first electrode of the third transistor T3. The twenty-fifth connection electrode 25 is configured to be connected to a reference signal line formed later.

In an exemplary embodiment, a main part of the first scan signal line 26 may be in the shape of a line extending along the first direction D1. The first scan signal line 26 may be connected to the first gate connection portion 11-2 of each sub-pixel through the seventh via hole V7, so as to implement the connection between the first scan signal line 26 and the first gate electrode 11 of each sub-pixel. The first scan signal line 26 may provide a first scan signal controlling turning-on or turning-off of the first transistor T1 to the first transistor T1 of each sub-pixel.

In an exemplary embodiment, because the first gate electrodes 11 of two adjacent sub-pixels in the first direction D1 are connected to each other to form an integrated structure, and two seventh via holes V7 (first gate via holes) are provided in a region where the first gate electrodes 11 of the integrated structure are located, the first scan signal line 26 is connected to the first gate electrodes 11 of the same integrated structure through the two seventh via holes V7.

In an exemplary embodiment, a main part of the second scan signal line 27 may be in the shape of a line, extending along the first direction D1. The second scan signal line 27 may be connected to the third gate connection portion 13-2 of each sub-pixel through the ninth via hole V9, so as to implement the connection between the second scan signal line 27 and the third gate electrode 13 of each sub-pixel. The second scan signal line 27 may provide a second scan signal controlling turning-on or turning-off of the third transistor T3 to the third transistor T3 of each sub-pixel.

In an exemplary embodiment, because the third gate electrodes 13 of two adjacent sub-pixels in the first direction D1 are connected to each other to form an integrated structure, and two ninth via holes V9 (third gate via holes) are provided in a region where the third gate electrodes 13 of the integrated structure are located, the second scan signal line 27 is connected to the third gate electrodes 13 of the same integrated structure through the two ninth via holes V9.

In an exemplary embodiment, an orthographic projection of the first scan signal line 26 on the silicon base overlaps at least partially with orthographic projections of the first gate electrode 11 and the third gate electrode 13 on the silicon base, and an orthographic projection of the second scan signal line 27 on the silicon base overlaps at least partially with the orthographic projections of the first gate electrode 11 and the third gate electrode 13 on the silicon base. In the present disclosure, both the first scan signal line and the second scan signal line are configured to overlap with the first gate electrode and the third gate electrode, facilitating reduction of the occupied areas of the first scan signal line and the second scan signal line and reduction of the occupied areas of the pixel driving circuits, thereby achieving the resolution of the display product.

In an exemplary embodiment, a main part of the bias voltage line 28 of each sub-pixel may be in the shape of a line extending along the first direction D1. The bias voltage line 28 may be connected to the contact electrode 4 of each sub-pixel through the tenth via hole V10, to enable the bias voltage line 28 to provide a low voltage to the contact electrode 4, perform low-voltage bias on the silicon base, implement electrical isolation of the devices, reduce parasitic effects between the devices and improve the stability of the pixel driving circuits.

In an exemplary embodiment, a main part of the bias connection line 29 of each sub-pixel may be in the shape of a strip, extending along the second direction D2. The bias connection line 29 may be disposed at one or both sides of the bias voltage line 28 in the second direction D2 and connected to the bias voltage line 28. The bias connection line 29 of each sub-pixel may be connected to the contact electrode 4 through a plurality of tenth via holes V10 to reduce the contact resistance and improve the connection reliability.

In an exemplary embodiment, the first scan signal line 26 may be located at one side close to the twenty-first connection electrode 21, and the second scan signal line 27 may be located at one side of the first scan signal line 26 away from the twenty-first connection electrode 21.

In an exemplary embodiment, the bias voltage line 28 may be located between the twenty-second connection electrode 22 and the twenty-third connection electrode 23. An orthographic projection of the bias voltage line 28 on the silicon base overlaps at least partially with an orthographic projection of the second gate electrode 12 on the silicon base.

In an exemplary embodiment, the width of the bias voltage line 28 may be greater than the width of the first scan signal line 26, and the width of the bias voltage line 28 may be greater than the width of the second scan signal line 27 to reduce the resistance of the bias voltage line 28 and improve the uniformity of the power supply voltage.

In an exemplary embodiment, the patterns of the second conductive layers of two adjacent sub-pixels in the first direction D1 may be mirror symmetrical with respect to the pixel centerline A, and the patterns of the second conductive layers of two adjacent sub-pixels in the second direction D2 may be substantially the same. For example, the patterns of the second conductive layers of the first sub-pixel P1 and the second sub-pixel P2 may be mirror symmetrical with respect to the pixel centerline A. As another example, the patterns of the second conductive layers of the second sub-pixel P2 and the third sub-pixel P3 may be mirror symmetrical with respect to the pixel centerline A.

Figure 9:
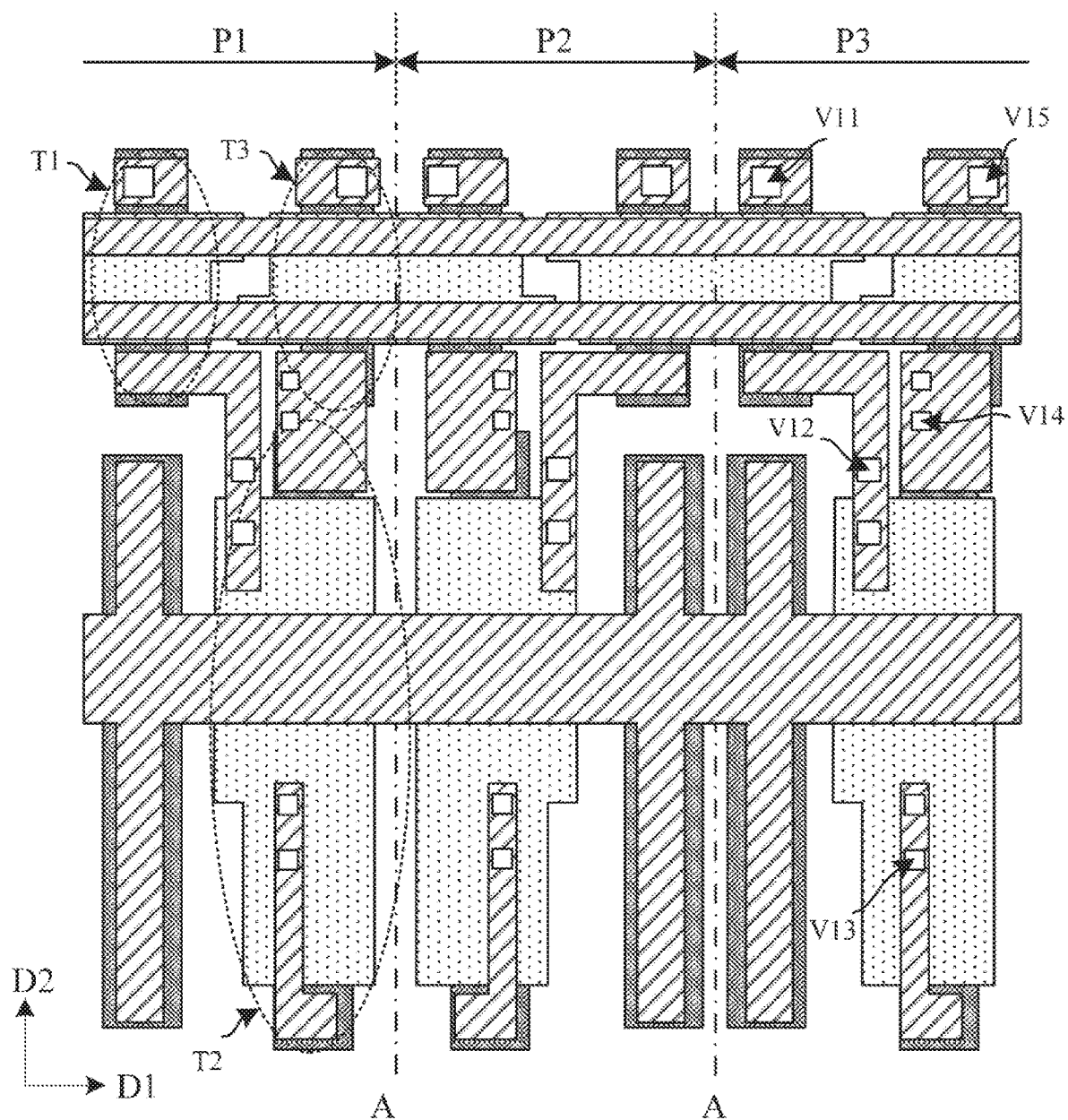
FIG. 9 is a schematic diagram of a display substrate after a pattern of a third insulation layer is formed in accordance with an embodiment of the present disclosure.

(5) A pattern of a third insulation layer is formed. In an exemplary embodiment, forming the pattern of the third insulation layer may include: depositing a third insulation film on the silicon base, on which the aforementioned patterns are formed, and patterning the third insulation film through the patterning process to form the third insulation layer overlaying the pattern of the second conductive layer. A plurality of via holes are provided in the third insulation layer, as shown in FIG. 9.

In an exemplary embodiment, the plurality of via holes in each sub-pixel may include an eleventh via hole V11, a twelfth via hole V12, a thirteenth via hole V13, a fourteenth via hole V14 and a fifteenth via hole V15.

In an exemplary embodiment, an orthographic projection of the eleventh via hole V11 on the silicon base may be within the range of an orthographic projection of the twenty-first connection electrode 21 on the silicon base. The third insulation layer in the eleventh via hole V11 is etched away to expose a surface of the twenty-first connection electrode 21. The eleventh via hole V11 is configured to connect a data signal line formed later with the twenty-first connection electrode 21 through this via hole.

In an exemplary embodiment, an orthographic projection of the twelfth via hole V12 on the silicon base may be within the range of an orthographic projection of the twenty-second connection electrode 22 on the silicon base. The third insulation layer in the twelfth via hole V12 is etched away to expose a surface of the twenty-second connection electrode 22. The twelfth via hole V12 is configured to connect a thirty-first connection electrode formed later with the twenty-second connection electrode 22 through this via hole.

In an exemplary embodiment, an orthographic projection of a thirteenth via hole V13 on the silicon base may be within the range of an orthographic projection of the twenty-third connection electrode 23 on the silicon base. The third insulation layer in the thirteenth via hole V13 is etched away to expose a surface of the twenty-third connection electrode 23. The thirteenth via hole V13 is configured to connect a thirty-second connection electrode formed later with the twenty-third connection electrode 23 through this via hole.

In an exemplary embodiment, an orthographic projection of the fourteenth via hole V14 on the silicon base may be within the range of an orthographic projection of the twenty-fourth connection electrode 24 on the silicon base. The third insulation layer in the fourteenth via hole V14 is etched away to expose a surface of the twenty-fourth connection electrode 24. The fourteenth via hole V14 is configured to connect a thirty-third connection electrode formed later with the twenty-fourth connection electrode 24 through this via hole.

In an exemplary embodiment, an orthographic projection of the fifteenth via hole V15 on the silicon base may be within the range of an orthographic projection of the twenty-fifth connection electrode 25 on the silicon base. The third insulation layer in the fifteenth via hole V15 is etched away to expose a surface of the twenty-fifth connection electrode 25. The fifteenth via hole V15 is configured to connect a reference signal line formed later with twenty-fifth connection electrode 25 through this via hole.

In an exemplary embodiment, there may be a plurality of eleventh via holes V11 through a plurality of fifteen via holes V15 to reduce the contact resistance and improve the connection reliability.

Figure 10A:
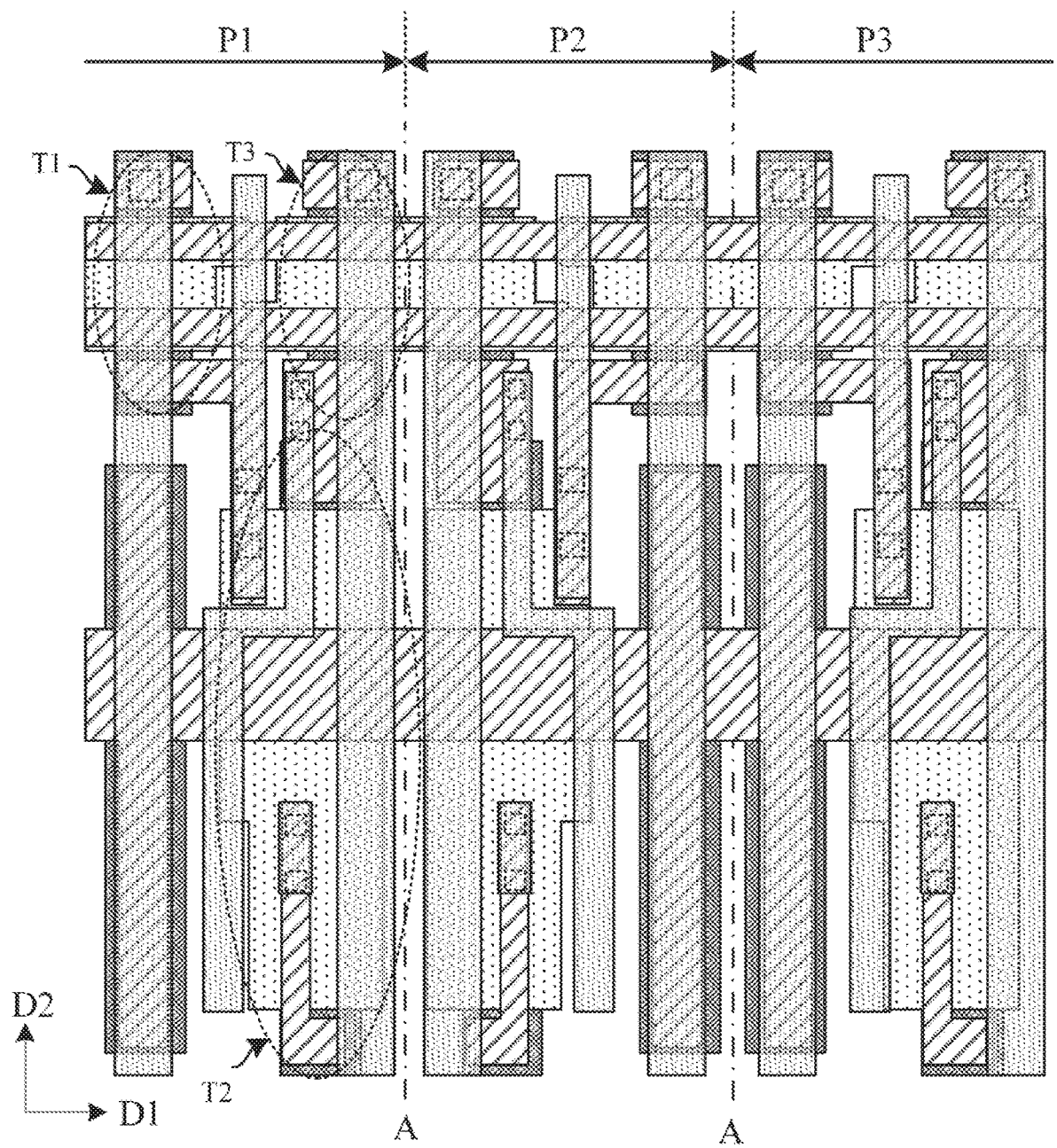
FIGS. 10A and 10B are schematic diagrams of a display substrate after a pattern of a third conductive layer is formed in accordance with an embodiment of the present disclosure.
Figure 10B:
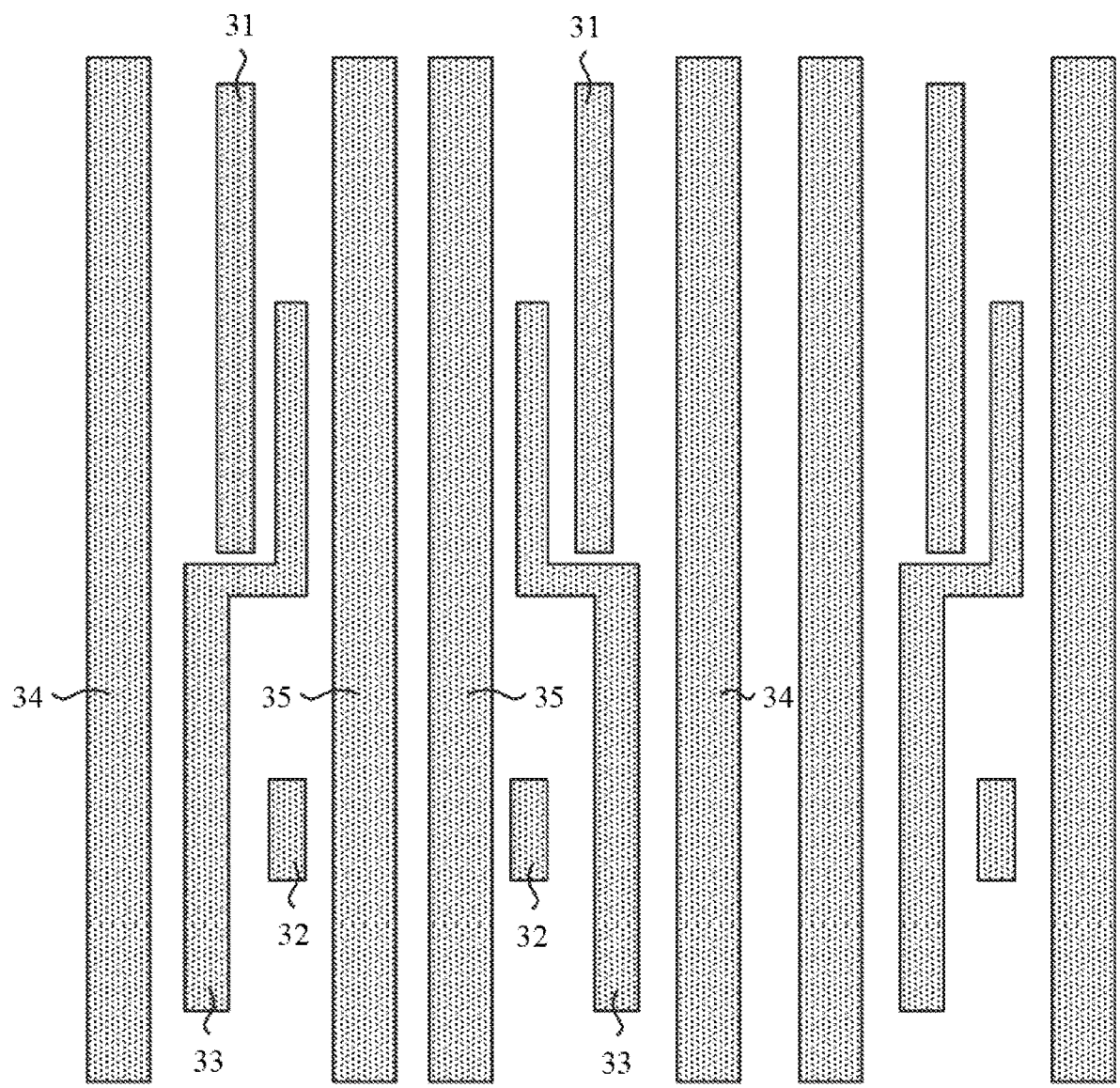

(6) A pattern of a third conductive layer is formed. In an exemplary embodiment, forming the pattern of the third conductive layer may include: depositing a third conductive film on the silicon base, on which the aforementioned patterns are formed, and patterning the third conductive film through the patterning process to form the pattern of the third conductive layer on the third insulation layer, as shown in FIGS. 10A and 10B. FIG. 10B is a schematic diagram of the third conductive layer in FIG. 10A. In an exemplary embodiment, the third conductive layer may be referred to as a second metal (Metal2) layer.

In an exemplary embodiment, the pattern of the third conductive layer in each sub-pixel may at least include a thirty-first connection electrode 31, a thirty-second connection electrode 32, a thirty-third connection electrode 33, a data signal line 34 and a reference signal line 35.

In an exemplary embodiment, the thirty-first connection electrode 31 may be in the shape of a strip extending along the second direction D2. An end of the thirty-first connection electrode 31 in the opposite direction of the second direction D2 (close to an end of the second transistor T2) may be connected to the twenty-second connection electrode 22 through the twelfth via hole V12. The thirty-first connection electrode 31 is configured to be connected to a forty-first connection electrode formed later.

In an exemplary embodiment, the thirty-second connection electrode 32 may be in the shape of a rectangle. The thirty-second connection electrode 32 may be connected to the twenty-third connection electrode 23 through the thirteenth via hole V13. The thirty-second connection electrode 32 is configured to be connected to a light emitting voltage line formed later.

In an exemplary embodiment, the thirty-third connection electrode 33 may be in the shape of a fold line extending along the second direction D2. An end of the thirty-third connection electrode 33 in the second direction D2 (close to an end of the third transistor T3) may be connected to the twenty-fourth connection electrode 24 through the fourteenth via hole V14.

The thirty-third connection electrode 33 is configured to be connected to a forty-second connection electrode formed later.

In an exemplary embodiment, the data signal line 34 may be in the shape of a line extending along the second direction D2. The data signal line 34 may be connected to the twenty-first connection electrode 21 through the eleventh via hole V11. Because the twenty-first connection electrode 21 is connected to the first region of the first active layer, the data signal line 34 can write a data signal into the first electrode of the first transistor T1.

In an exemplary embodiment, the reference signal line 35 may be in the shape of a line extending along the second direction D2. The reference signal line 35 may be connected to the twenty-fifth connection electrode 25 through the fifteenth via hole V15. Because the twenty-fifth connection electrode 25 is connected to the first region of the third active layer, the reference signal line 35 can write a reference signal into the first electrode of the third transistor T3.

In an exemplary embodiment, the patterns of the third conductive layers of two adjacent sub-pixels in the first direction D1 may be mirror symmetrical with respect to the pixel centerline A, and the patterns of the third conductive layers of two adjacent sub-pixels in the second direction D2 may be substantially the same. For example, the patterns of the third conductive layers of the first sub-pixel P1 and the second sub-pixel P2 may be mirror symmetrical with respect to the pixel centerline A. As another example, the patterns of the third conductive layers of the second sub-pixel P2 and the third sub-pixel P3 may be mirror symmetrical with respect to the pixel centerline A.

Figure 11:
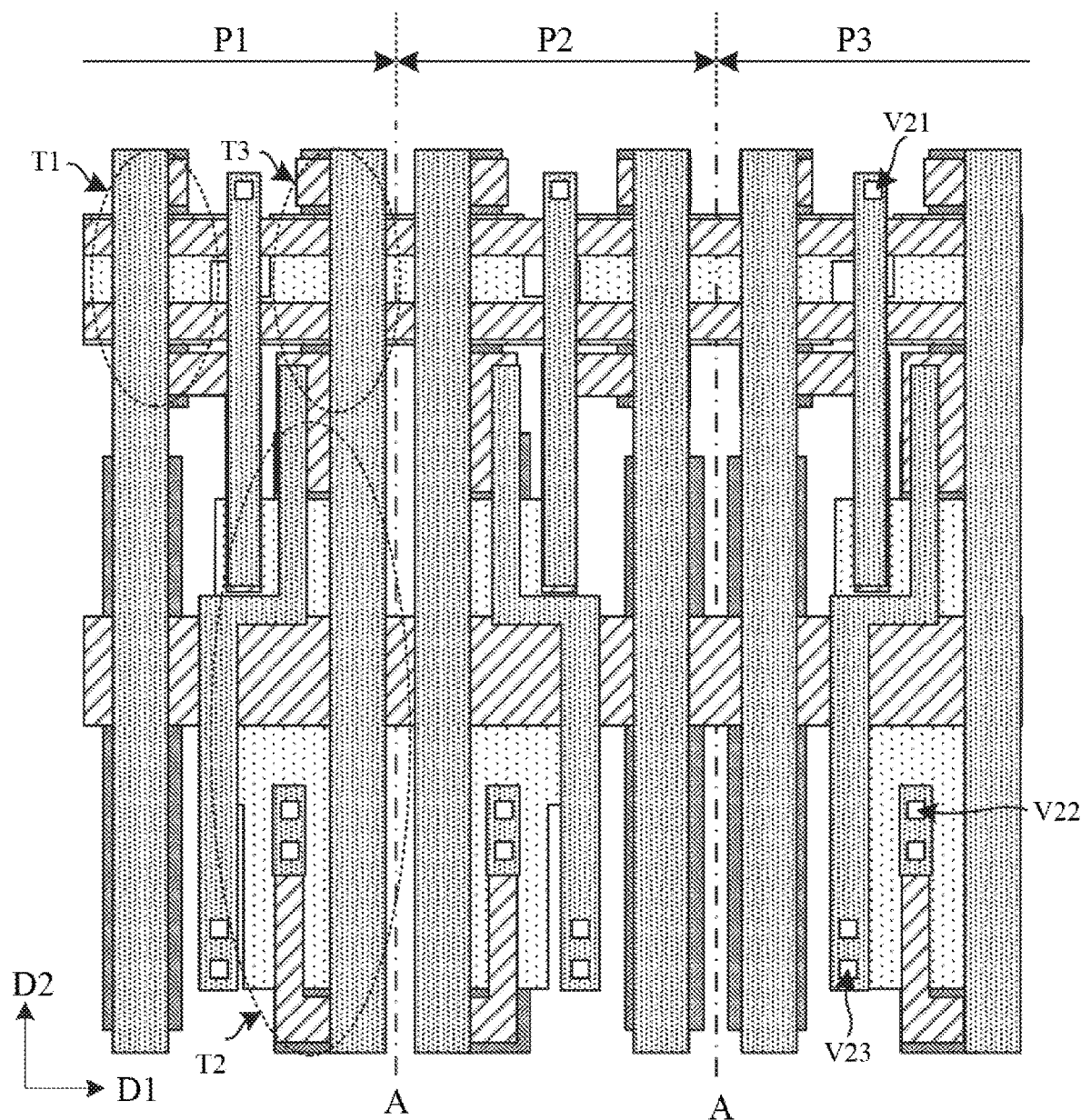
FIG. 11 is a schematic diagram of a display substrate after a pattern of a fourth insulation layer is formed in accordance with an embodiment of the present disclosure.

(7) A pattern of a fourth insulation layer is formed. In an exemplary embodiment, forming the pattern of the fourth insulation layer may include: depositing a fourth insulation film on the silicon base, on which the aforementioned patterns are formed, and patterning the fourth insulation film through the patterning process to form the fourth insulation layer overlaying the patterns of the third conductive layer. A plurality of via holes is provided in the fourth insulation layer, as shown in FIG. 11.

In an exemplary embodiment, the plurality of via holes in each sub-pixel may include a twenty-first via hole V21, a twenty-second via hole V22 and a twenty-third via hole V23.

In an exemplary embodiment, an orthographic projection of the twenty-first via hole V21 on the silicon base is within the range of an orthographic projection of an end of the thirty-first connection electrode 31 in the second direction D2 on the silicon base. The fourth insulation layer in the twenty-first via hole V21 is etched away to expose a surface of the thirty-first connection electrode 31. The twenty-first via hole V21 is configured to connect a forty-first connection electrode formed later with the thirty-first connection electrode 31 through this via hole.

In an exemplary embodiment, an orthographic projection of the twenty-second via hole V22 on the silicon base is within the range of an orthographic projection of the thirty-second connection electrode 32 on the silicon base. The fourth insulation layer in the twenty-second via hole V22 is etched away to expose a surface of the thirty-second connection electrode 32. The twenty-second via hole V22 is configured to connect a light emitting voltage line formed later with the thirty-second connection electrode 32 through this via hole.

In an exemplary embodiment, an orthographic projection of the twenty-third via hole V23 on the silicon base is within the range of an orthographic projection of an end of the thirty-third connection electrode 33 in the opposite direction of the second direction D2 on the silicon base. The fourth insulation layer in the twenty-third via hole V23 is etched away to expose a surface of the thirty-third connection electrode 33. The twenty-third via hole V23 is configured to connect a forty-second connection electrode formed later with the thirty-third connection electrode 33 through this via hole.

Figure 12A:
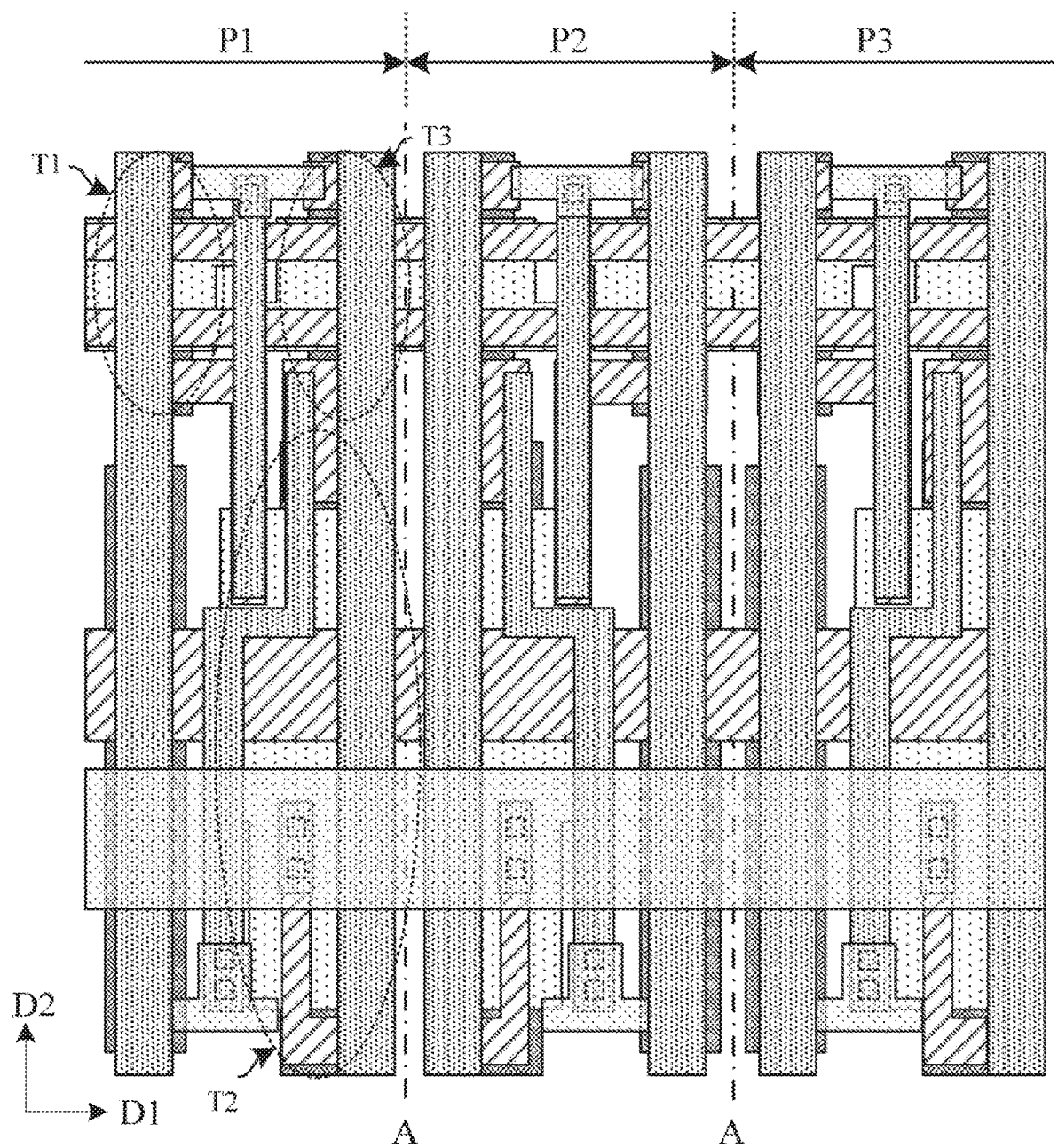
FIGS. 12A and 12B are schematic diagrams of a display substrate after a pattern of a fourth conductive layer is formed in accordance with an embodiment of the present disclosure.
Figure 12B:
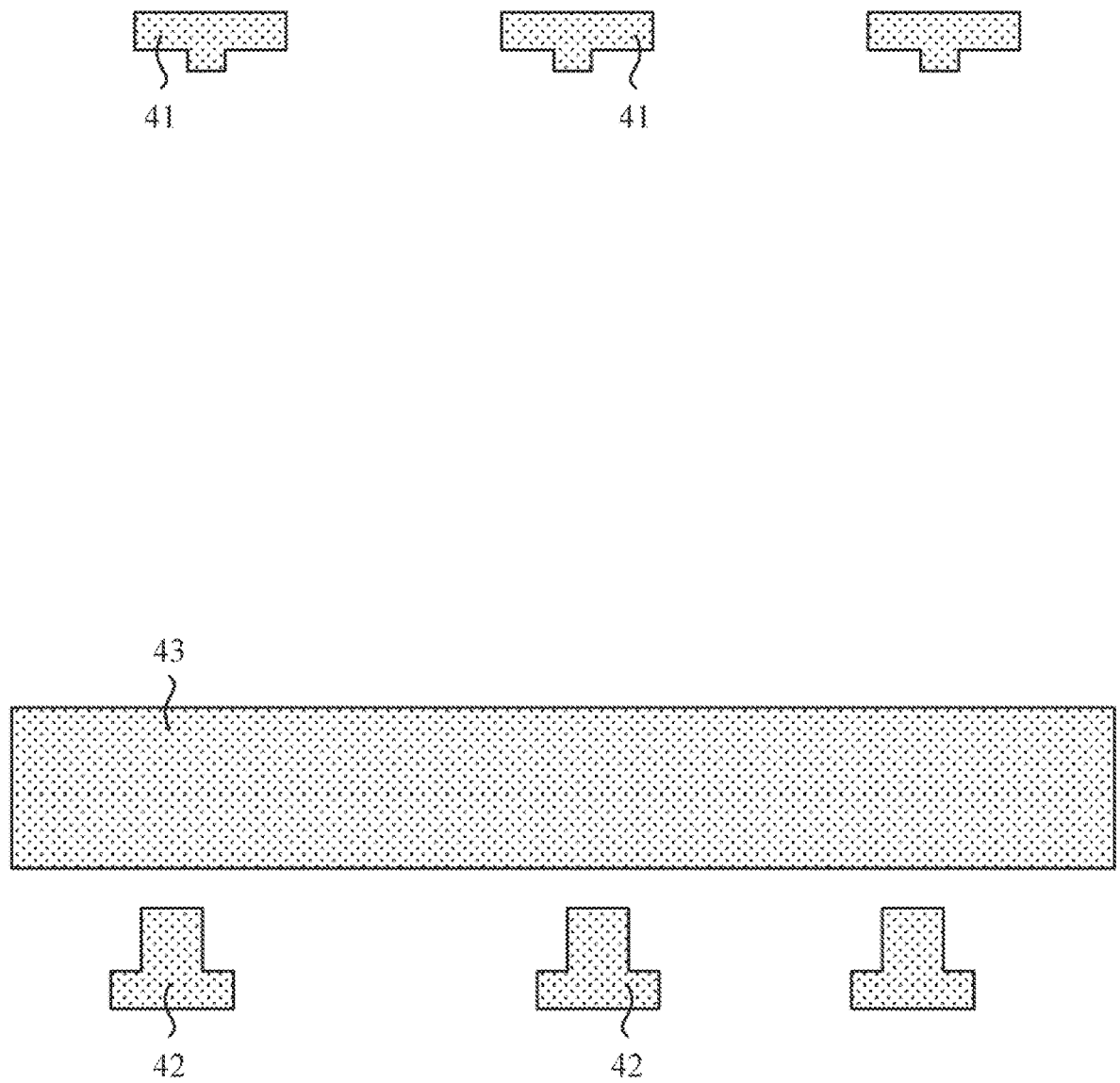

(8) A pattern of a fourth conductive layer is formed. In an exemplary embodiment, forming the pattern of the fourth conductive layer may include: depositing a fourth conductive film on the silicon base, on which the aforementioned patterns are formed, and patterning the fourth conductive film through the patterning process to form the pattern of the fourth conductive layer on the fourth insulation layer, as shown in FIGS. 12A and 2B. FIG. 12B is a schematic diagram of the fourth conductive layer in FIG. 12A. In an exemplary embodiment, the fourth conductive layer may be referred to as a third metal (Metal3) layer.

In an exemplary embodiment, the pattern of the fourth conductive layer may at least include a forty-first connection electrode 41, a forty-second connection electrode 42 and a light emitting voltage line 43.

In an exemplary embodiment, the forty-first connection electrode 41 may be in the shape of the letter "T". The forty-first connection electrode 41 may be connected to the thirty-first connection electrode 31 through the twenty-first via hole V21. The forty-first connection electrode 41 is configured to be connected to a fifty-first connection electrode formed later.

In an exemplary embodiment, the forty-second connection electrode 42 may be in the shape of the letter "T". The forty-second connection electrode 42 may be connected to the thirty-third connection electrode 33 through the twenty-third via hole V23. The forty-second connection electrode 42 is configured to be connected to a fifty-second connection electrode formed later.

In an exemplary embodiment, a main part of the light emitting voltage line 43 may be in the shape of a line extending along the first direction D1. The light emitting voltage line 43 may be connected to the thirty-second connection electrode 32 through the twenty-second via hole V22. Because the light emitting voltage line 43, which is connected to a second electrode of a light emitting control transistor located in a border area, is configured to output a light emitting voltage signal, the thirty-second connection electrode 32 is connected to the twenty-third connection electrode 23 through a via hole, and the twenty-third connection electrode 23 is connected to the first region of the second active layer through a via hole, the light emitting voltage line 43 can be enabled to write the light emitting voltage signal into the first electrode of the second transistor T2.

In an exemplary embodiment, the patterns of the fourth conductive layers of two adjacent sub-pixels in the first direction D1 may be mirror symmetrical with respect to the pixel centerline A, and the patterns of the fourth conductive layers of two adjacent sub-pixels in the second direction D2 may be substantially the same. For example, the patterns of the fourth conductive layers of the first sub-pixel P1 and the second sub-pixel P2 may be mirror symmetrical with respect to the pixel centerline A. As another example, the patterns of the fourth conductive layers of the second sub-pixel P2 and the third sub-pixel P3 may be mirror symmetrical with respect to the pixel centerline A.

Figure 13:
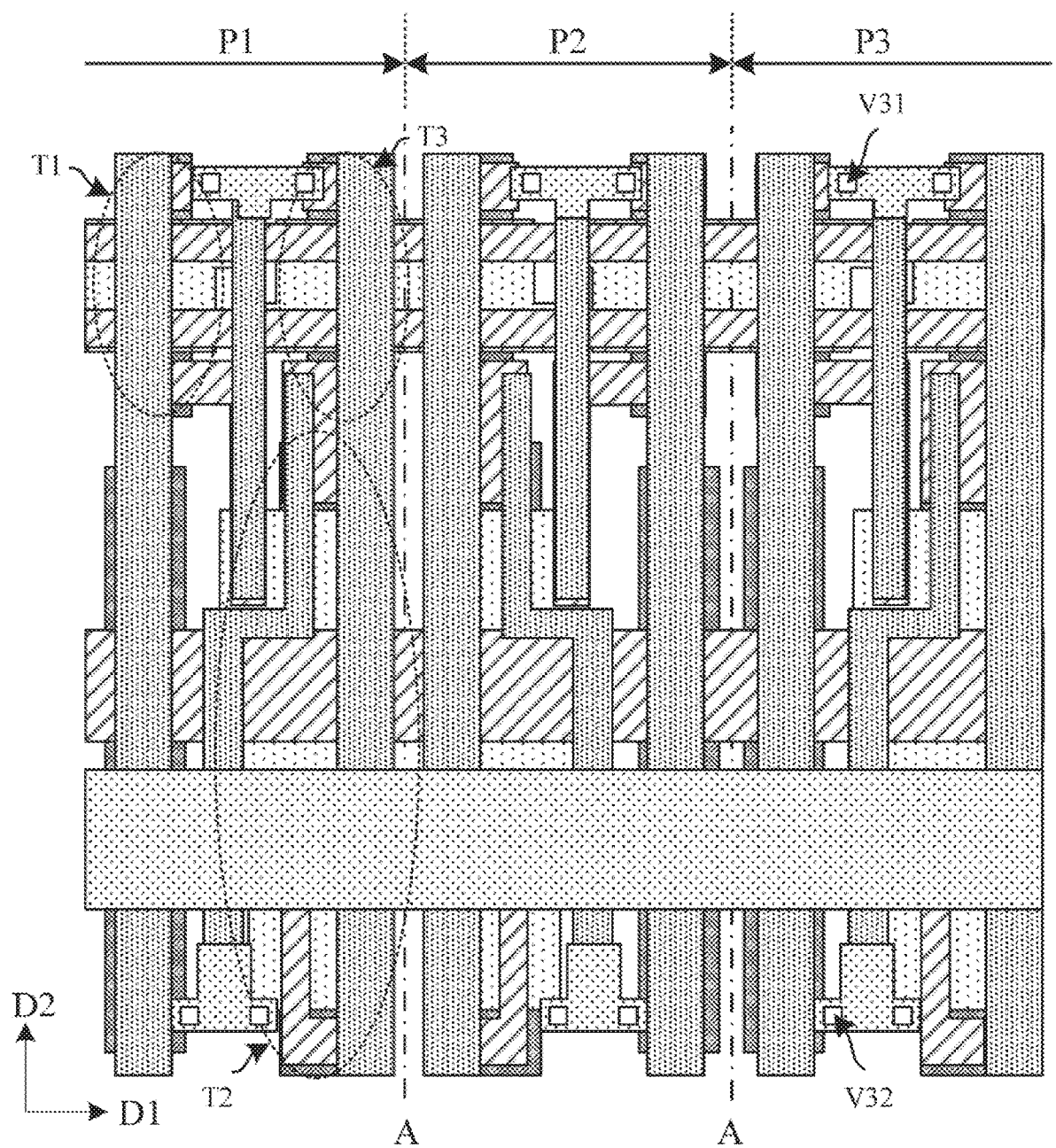
FIG. 13 is a schematic diagram of a display substrate after a pattern of a fifth insulation layer is formed in accordance with an embodiment of the present disclosure.

(9) A pattern of a fifth insulation layer is formed. In an exemplary embodiment, forming the pattern of the fifth insulation layer may include: depositing a fifth insulation film on the silicon base, on which the aforementioned patterns are formed, and patterning the fifth insulation film through the patterning process to form the fifth insulation layer overlaying the pattern of the fourth conductive layer. A plurality of via holes are provided in the fifth insulation layer, as shown in FIG. 13.

In an exemplary embodiment, the plurality of via holes in each sub-pixel may include a thirty-first via hole V31 and a thirty-second via hole V52.

In an exemplary embodiment, an orthographic projection of the thirty-first via hole V31 on the silicon base is within the range of an orthographic projection of the forty-first connection electrode 41 on the silicon base. The fifth insulation layer in the thirty-first via hole V31 is etched away to expose a surface of the forty-first connection electrode 41. The thirty-first via hole V31 is configured to connect a fifty-first connection electrode formed later with the forty-first connection electrode 41 through this via hole.

In an exemplary embodiment, an orthographic projection of the thirty-second via hole V32 on the silicon base is within the range of an orthographic projection of the forty-second connection electrode 402 on the silicon base. The fifth insulation layer in the thirty-second via hole V32 is etched away to expose a surface of the forty-second connection electrode 42. The thirty-second via hole V32 is configured to connect a fifty-second connection electrode formed later with the forty-second connection electrode 42 through this via hole.

In an exemplary embodiment, a plurality of thirty-first via holes V31 and a plurality of thirty-second via holes V32 may be arranged in sequence along the first direction D1 to reduce the contact resistance and improve the connection reliability.

Figure 14A:
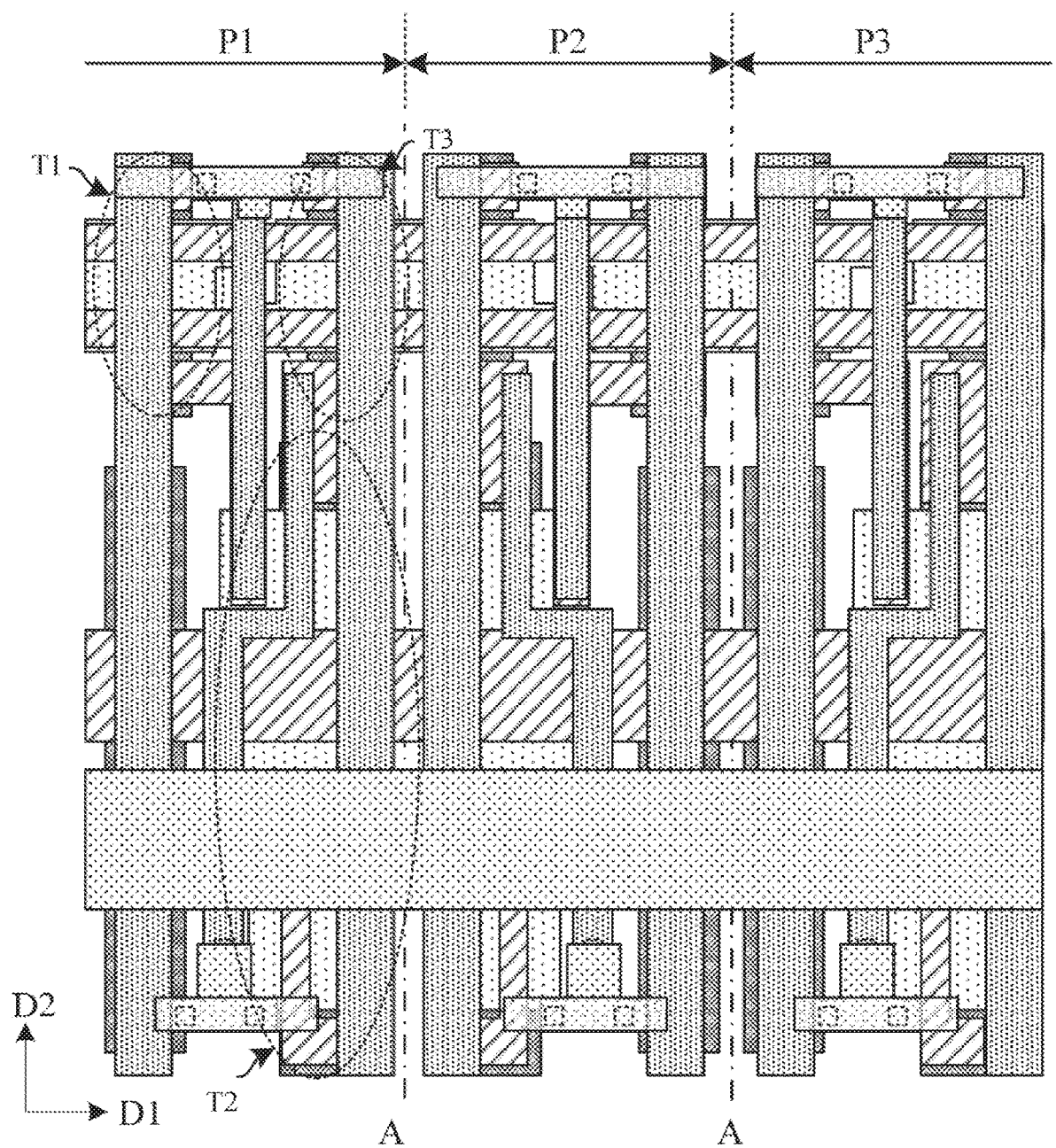
FIGS. 14A and 14B are schematic diagrams of a display substrate after a pattern of a fifth conductive layer is formed in accordance with an embodiment of the present disclosure.
Figure 14B:
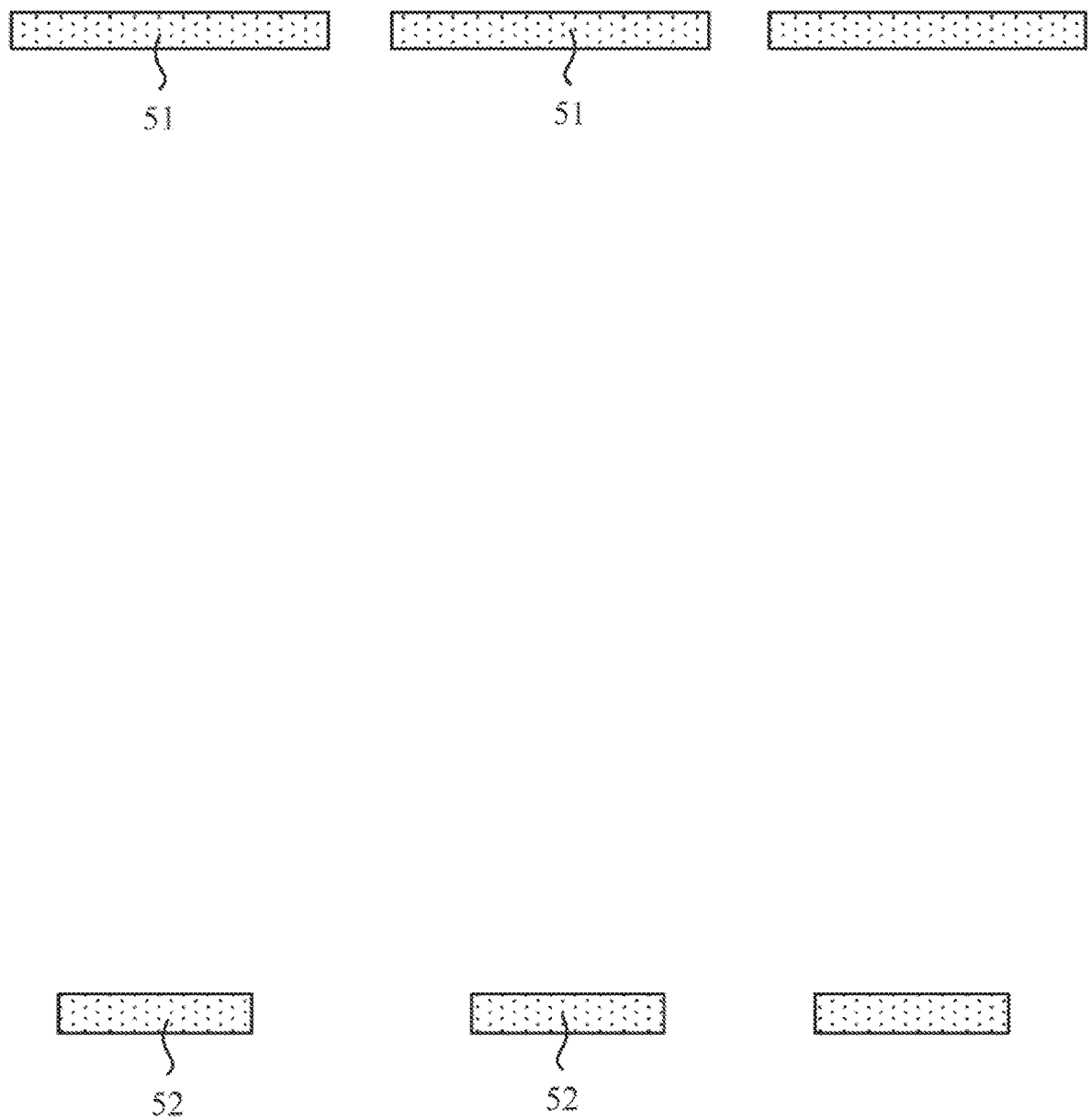

(10) A pattern of a fifth conductive layer is formed. In an exemplary embodiment, forming the pattern of the fifth conductive layer may include: depositing a fifth conductive film on the silicon base, on which the aforementioned patterns are formed, and patterning the fifth conductive film through the patterning process to form the pattern of the fifth conductive layer on the fifth insulation layer, as shown in FIGS. 14A and 14B. FIG. 14B is a schematic diagram of the fifth conductive layer in FIG. 14A. In an exemplary embodiment, the fifth conductive layer may be referred to as a fourth metal (Metal4) layer.

In an exemplary embodiment, the pattern of the fifth conductive layer may at least include a fifty-first connection electrode 51 and a fifty-second connection electrode 52.

In an exemplary embodiment, the fifty-first connection electrode 51 may be in the shape of a strip extending along the first direction D1. The fifty-first connection electrode 51 may be connected to the forty-first connection electrode 41 through a plurality of thirty-first via holes V31. The fifty-first connection electrode 51 is configured to be connected to the first plate formed later.

In an exemplary embodiment, the fifty-second connection electrode 52 may be in the shape in the shape of a strip extending along the first direction D1. The fifty-second connection electrode 52 may be connected to the forty-second connection electrode 42 through a plurality of thirty-second via holes V32. The fifty-second connection electrode 52 is configured to be connected to a sixty-second connection electrode formed later.

In an exemplary embodiment, the patterns of the fifth conductive layers of two adjacent sub-pixels in the first direction D1 may be mirror symmetrical with respect to the pixel centerline A, and the patterns of the fifth conductive layers of two adjacent sub-pixels in the second direction D2 may be substantially the same. For example, the patterns of the fifth conductive layers of the first sub-pixel P1 and the second sub-pixel P2 may be mirror symmetrical with respect to the pixel centerline A. As another example, the patterns of the fifth conductive layers of the second sub-pixel P2 and the third sub-pixel P3 may be mirror symmetrical with respect to the pixel centerline A.

Figure 15:
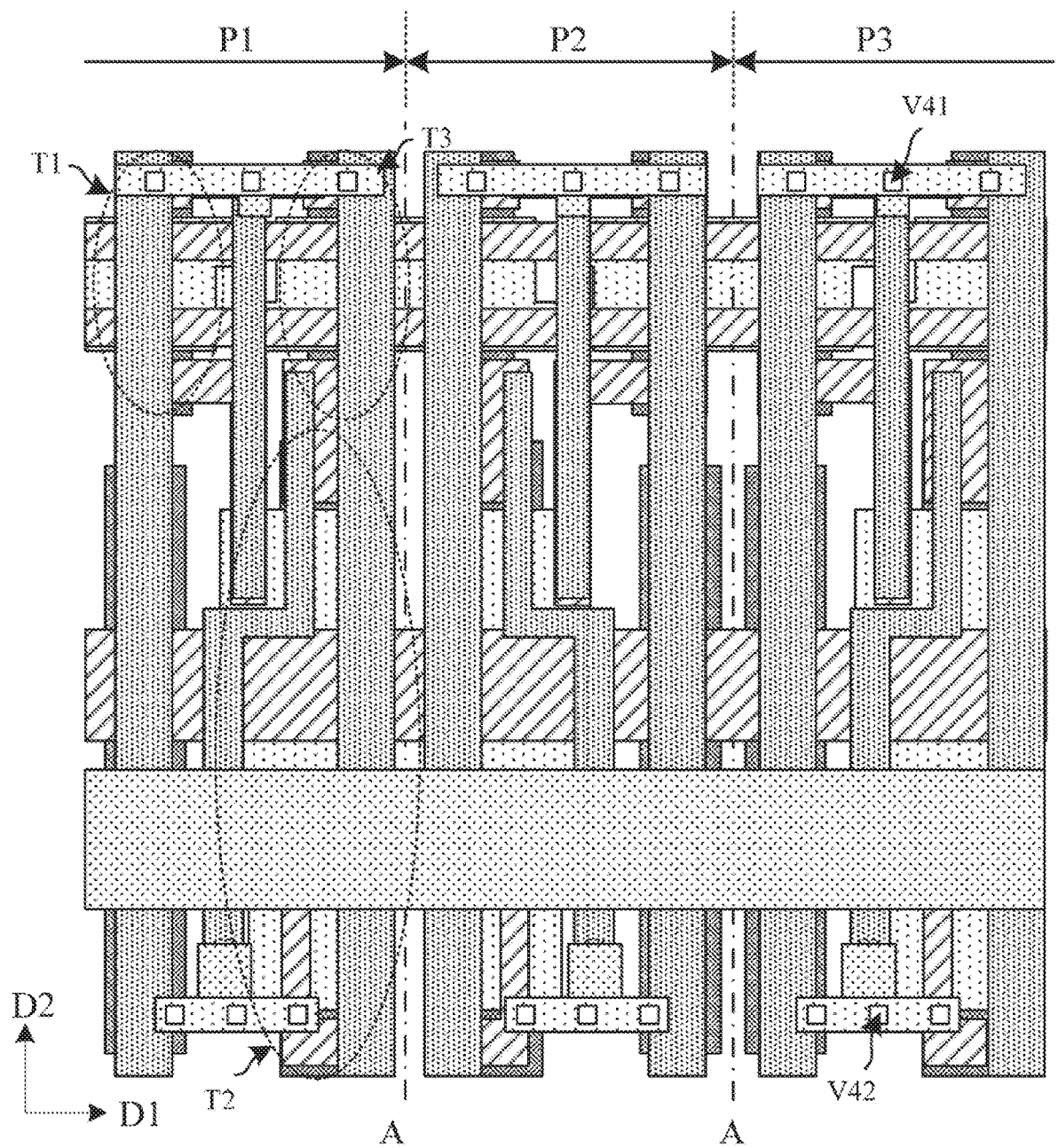
FIG. 15 is a schematic diagram of a display substrate after a pattern of a sixth insulation layer is formed in accordance with an embodiment of the present disclosure.

(11) A pattern of the sixth insulation layer is formed. In an exemplary embodiment, forming the pattern of the sixth insulation layer may include: depositing a sixth insulation film on the silicon base, on which the aforementioned patterns are formed, and patterning the sixth insulation film through the patterning process to form the sixth insulation layer overlaying the pattern of the fifth conductive layer. A plurality of via holes are provided in the sixth insulation layer, as shown in FIG. 15.

In an exemplary embodiment, the plurality of via holes of each sub-pixel may include a forty-first via hole V41 and a forty-second via hole V42.

In an exemplary embodiment, an orthographic projection of the forty-first via hole V41 on the silicon base is within the range of an orthographic projection of the fifty-first connection electrode 51 on the silicon base. The sixth insulation layer in the forty-first via hole V41 is etched away to expose a surface of the fifty-first connection electrode 51. The forty-first via hole V41 is configured to connect a first plate formed later with the fifty-first connection electrode 51 through this via hole.

In an exemplary embodiment, an orthographic projection of the forty-second via hole V42 on the silicon base is within the range of an orthographic projection of the fifty-second connection electrode 52 on the silicon base. The sixth insulation layer in the forty-second via hole V42 is etched away to expose a surface of the fifty-second connection electrode 52. The forty-second via hole V42 is configured to connect a sixty-first connection electrode formed later with the fifty-second connection electrode 52 through this via hole.

In an exemplary embodiment, a plurality of forty-first via holes V41 and a plurality of forty-second via holes V42 may be arranged in sequence along the first direction D1 to reduce the contact resistance and improve the connection reliability.

Figure 16A:
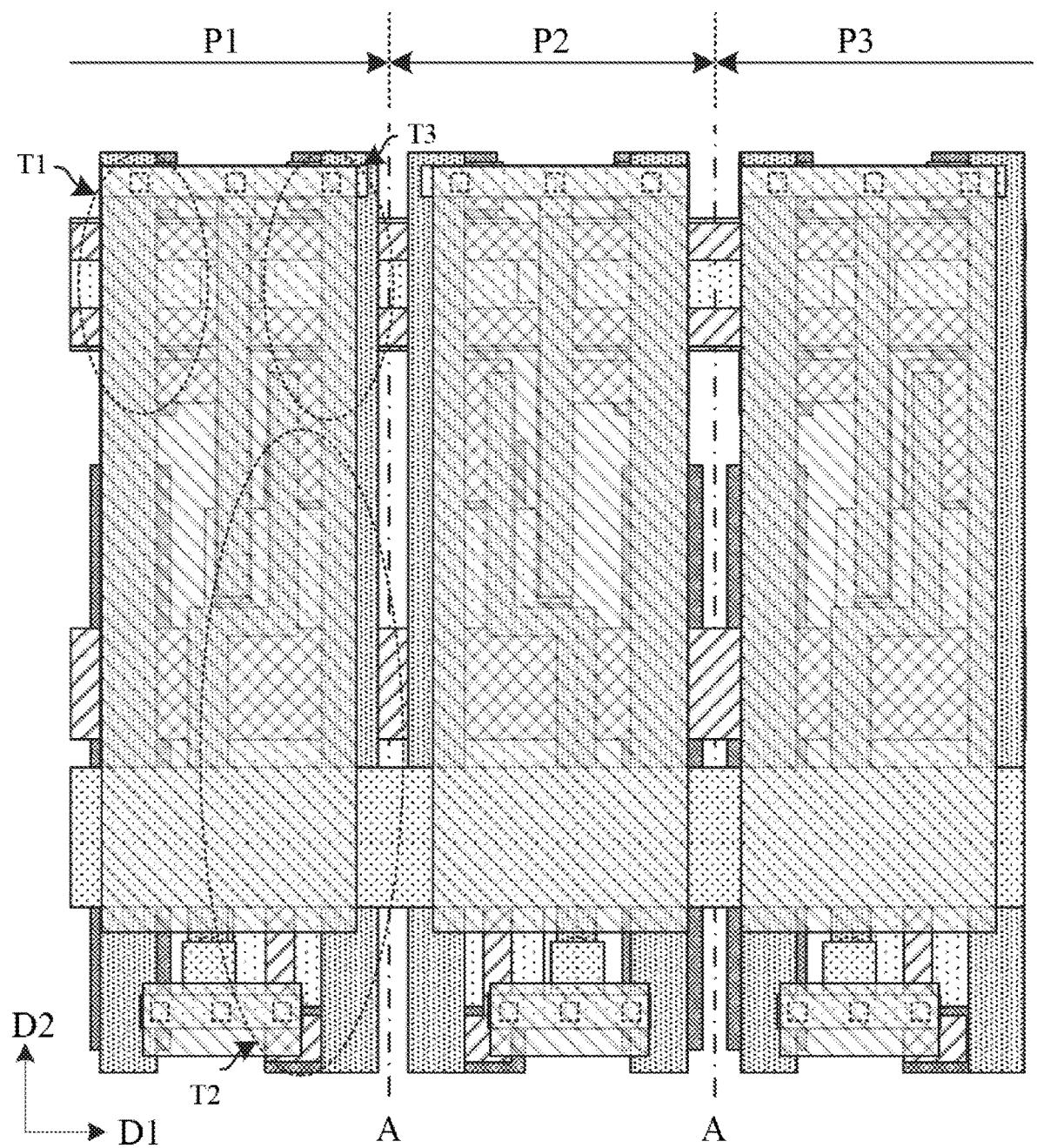
FIGS. 16A and 16B is a schematic diagram of a display substrate after a pattern of a sixth conductive layer is formed in accordance with an embodiment of the present disclosure.
Figure 16B:
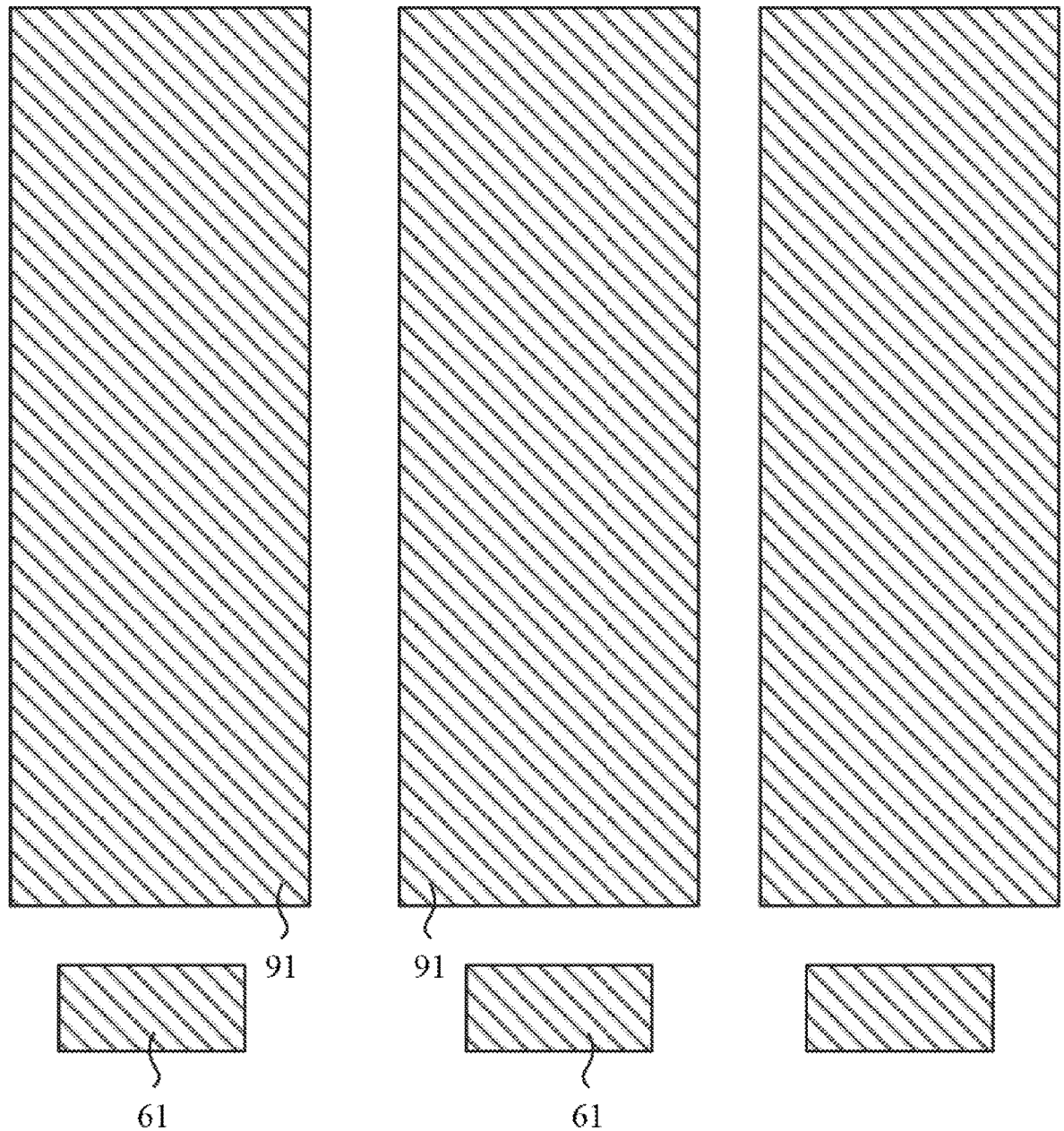

(12) A pattern of a sixth conductive layer is formed. In an exemplary embodiment, forming the pattern of the sixth conductive layer may include: depositing a sixth conductive film on the silicon base, on which the aforementioned patterns are formed, and patterning the sixth conductive film through the patterning process to form the pattern of the sixth conductive layer on the sixth insulation layer, as shown in FIGS. 16A and 16B. FIG. 16B is a schematic diagram of the sixth conductive layer in FIG. 16A. In an exemplary embodiment, the sixth conductive layer may be referred to as a fifth metal (Metal5) layer.

In an exemplary embodiment, the pattern of the sixth conductive layer in each sub-pixel may at least include a sixty-first connection electrode 61 and a first plate 91 of a storage capacitor.

In an exemplary embodiment, the sixty-first connection electrode 61 may be in the shape of a rectangle. The sixty-first connection electrode 61 may be connected to the fifty-second connection electrode 52 through a plurality of forty-second via holes V42. The sixty-first connection electrode 61 is configured to be connected to a cathode connection electrode formed later.

In an exemplary embodiment, the first plate 91 of the storage capacitor may be in the shape of a rectangle. The first plate 91 may be connected to the fifty-first connection electrode 51 through a plurality of forty-first via holes V41. The first plate 91 is configured to serve as one plate of the storage capacitor. Because the fifty-first connection electrode 51 is connected to the forty-first connection electrode 41 through a via hole, the forty-first connection electrode 41 is connected to the thirty-first connection electrode 31 through a via hole, the thirty-first connection electrode 31 is connected to the twenty-second connection electrode 22 through a via hole, and the twenty-second connection electrode 22 is connected to the second region of the first active layer and the gate electrode of the second transistor T2 respectively through via holes, the first plate 91, the second electrode of the first transistor T1 and the gate electrode of the second transistor T2 can have the same potential (the first node N1 of the pixel driving circuit).

In an exemplary embodiment, the patterns of the sixth conductive layers of two adjacent sub-pixels in the first direction D1 may be mirror symmetrical with respect to the pixel centerline A, and the patterns of the sixth conductive layers of two adjacent sub-pixels in the second direction D2 may be substantially the same. For example, the patterns of the sixth conductive layers of the first sub-pixel P1 and the second sub-pixel P2 may be mirror symmetrical with respect to the pixel centerline A. As another example, the patterns of the sixth conductive layers of the second sub-pixel P2 and the third sub-pixel P3 may be mirror symmetrical with respect to the pixel centerline A.

Figure 17A:
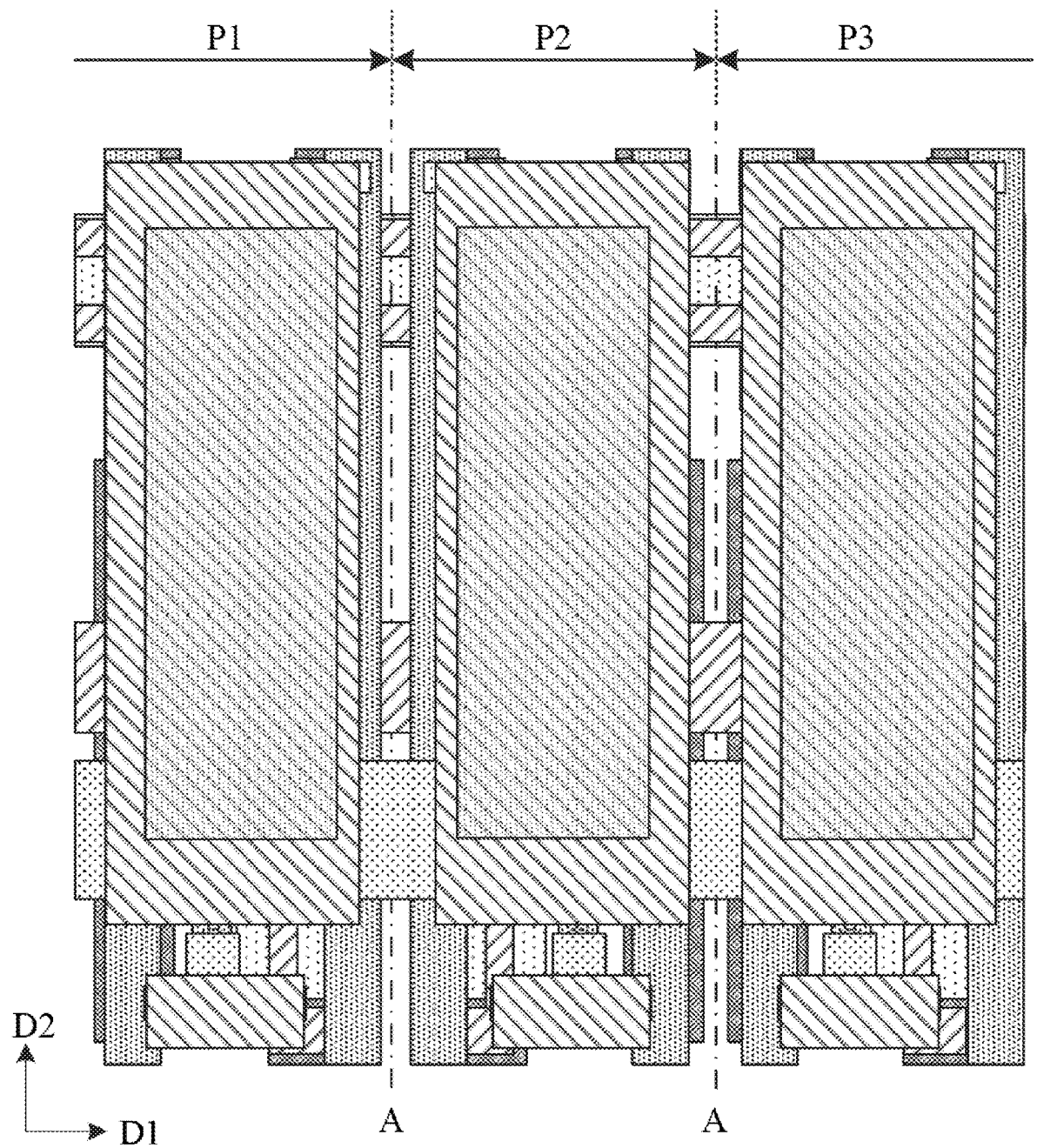
FIGS. 17A and 17B are schematic diagrams of a display substrate after a pattern of a seventh conductive layer is formed in accordance with an embodiment of the present disclosure.
Figure 17B:
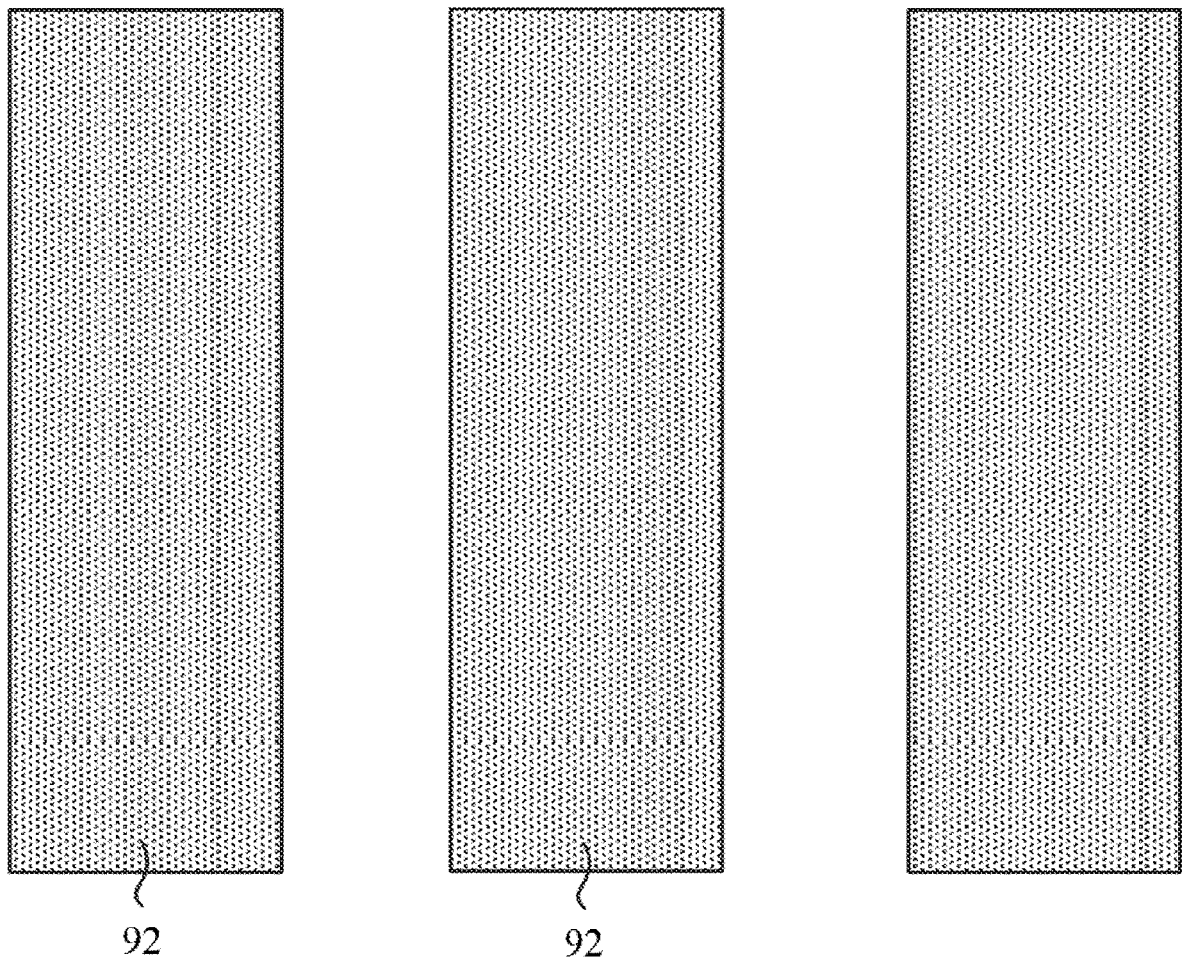

(13) A pattern of a seventh conductive layer is formed. In an exemplary embodiment, forming the pattern of the seventh conductive layer may include: depositing in sequence a seventh insulation film and a seventh conductive film on the silicon base, on which the aforementioned patterns are formed, and patterning the seventh conductive film through the patterning process to form a seventh insulation layer overlaying the pattern of the sixth conductive layer and the pattern of the seventh conductive layer disposed on the seventh insulation layer, as shown in FIGS. 17A and 17B. FIG. 17B is a schematic diagram of the seventh conductive layer in FIG. 17A. In an exemplary embodiment, the seventh conductive layer may be referred to as a metal-insulator-metal (MIM) layer.

In an exemplary embodiment, the seventh conductive layer in each sub-pixel may at least include a second plate 92 of the storage capacitor.

In an exemplary embodiment, the second plate 92 may be in the shape of a rectangle. An orthographic projection of the second plate 92 on the silicon base overlaps at least partially with an orthographic projection of the first plate 91 on the silicon base. The second plate 92 is configured to serve as the other plate of the storage capacitor. The first plate 91 and the second plate 92 constitute the storage capacitor of the pixel driving circuit.

In an exemplary embodiment, an area of the second plate 92 may be less than an area of the first plate 91. The orthographic projection of the second plate 92 on the silicon base may be within the range of the orthographic projection of the first plate 91 on the silicon base.

In an exemplary embodiment, the patterns of the seventh conductive layers of two adjacent sub-pixels in the first direction D1 may be mirror symmetrical with respect to the pixel centerline A, and the patterns of the seventh conductive layers of two adjacent sub-pixels in the second direction D2 may be substantially the same. For example, the patterns of the seventh conductive layers of the first sub-pixel P1 and the second sub-pixel P2 may be mirror symmetrical with respect to the pixel centerline A. As another example, the patterns of the seventh conductive layers of the second sub-pixel P2 and the third sub-pixel P3 may be mirror symmetrical with respect to the pixel centerline A.

Figure 18:
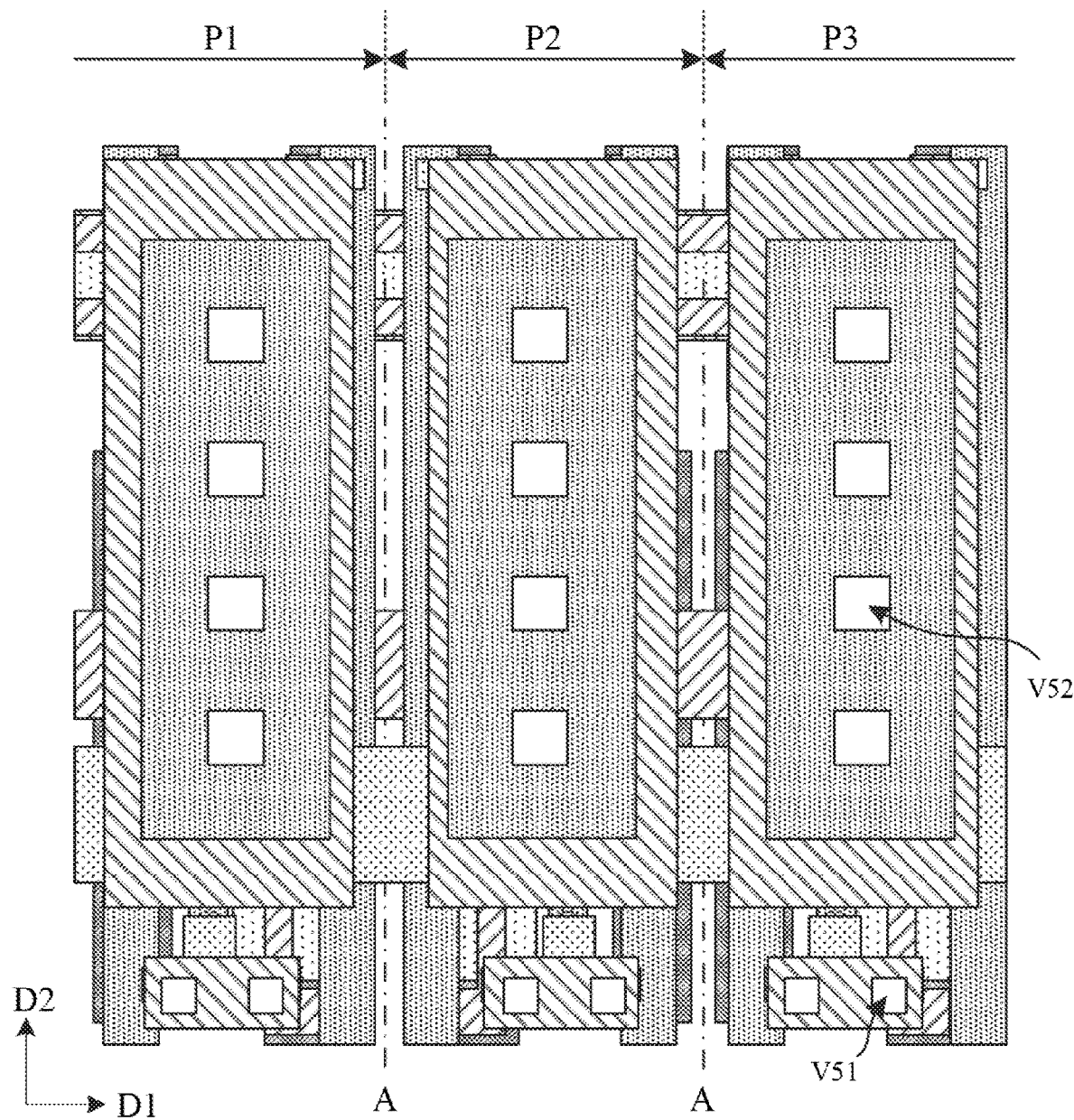
FIG. 18 is a schematic diagram of a display substrate after a pattern of an eighth insulation layer is formed in accordance with an embodiment of the present disclosure.

(14) A pattern of an eighth insulation layer is formed. In an exemplary embodiment, forming the pattern of the eighth insulation layer may include: depositing an eighth insulation film on the silicon base, on which the aforementioned patterns are formed, and patterning the eighth insulation film through the patterning process to form the eighth insulation layer overlaying the patterns of the seventh conductive layer. A plurality of via holes are provided in the eighth insulation layer, as shown in FIG. 18.

In an exemplary embodiment, the plurality of via holes in each sub-pixel may include a fifty-first via hole V51 and a fifty-second via hole V52.

In an exemplary embodiment, an orthographic projection of the fifty-first via hole V51 on the silicon base is within the range of an orthographic projection of the sixty-first connection electrode 61 on the silicon base. The seventh insulation layer and the eighth insulation layer in the fifty-first via hole V51 are etched away to expose a surface of the sixty-first connection electrode 61. The fifty-first via hole V51 is configured to connect an anode connection electrode formed later with the sixty-first connection electrode 61 through the this via hole.

In an exemplary embodiment, an orthographic projection of the fifty-second via hole V52 on the silicon base is within the range of the orthographic projection of the second plate 92 on the silicon base. The eighth insulation layer in the fifty-second via hole V52 is etched away to expose a surface of the second plate 92. The fifty-second via hole V52 is configured to connect a first power supply line formed later with the second plate 92 through this via hole.

Figure 19A:
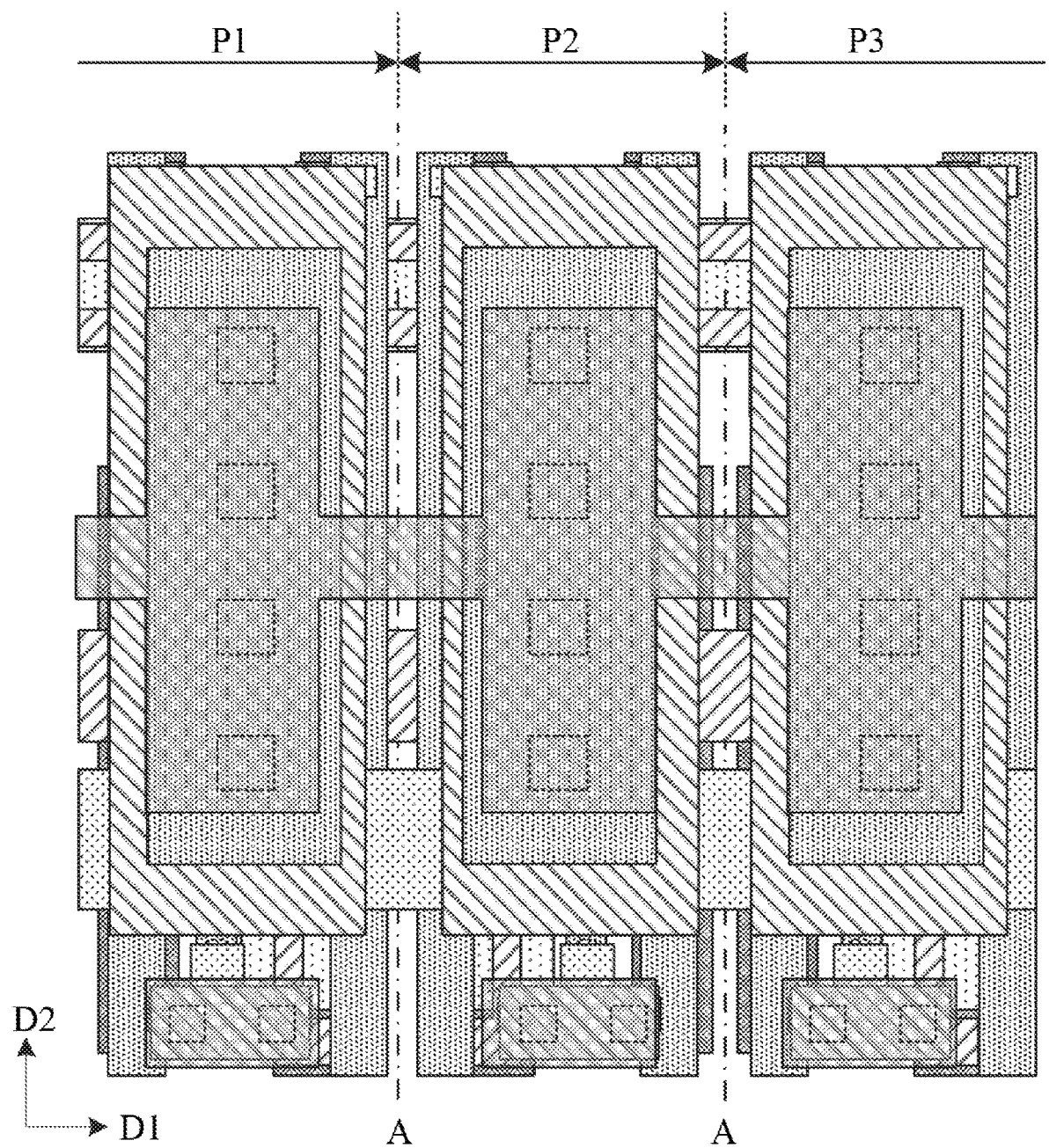
FIGS. 19A and 19B are schematic diagrams of a display substrate after a pattern of an eighth conductive layer is formed in accordance with an embodiment of the present disclosure.
Figure 19B:
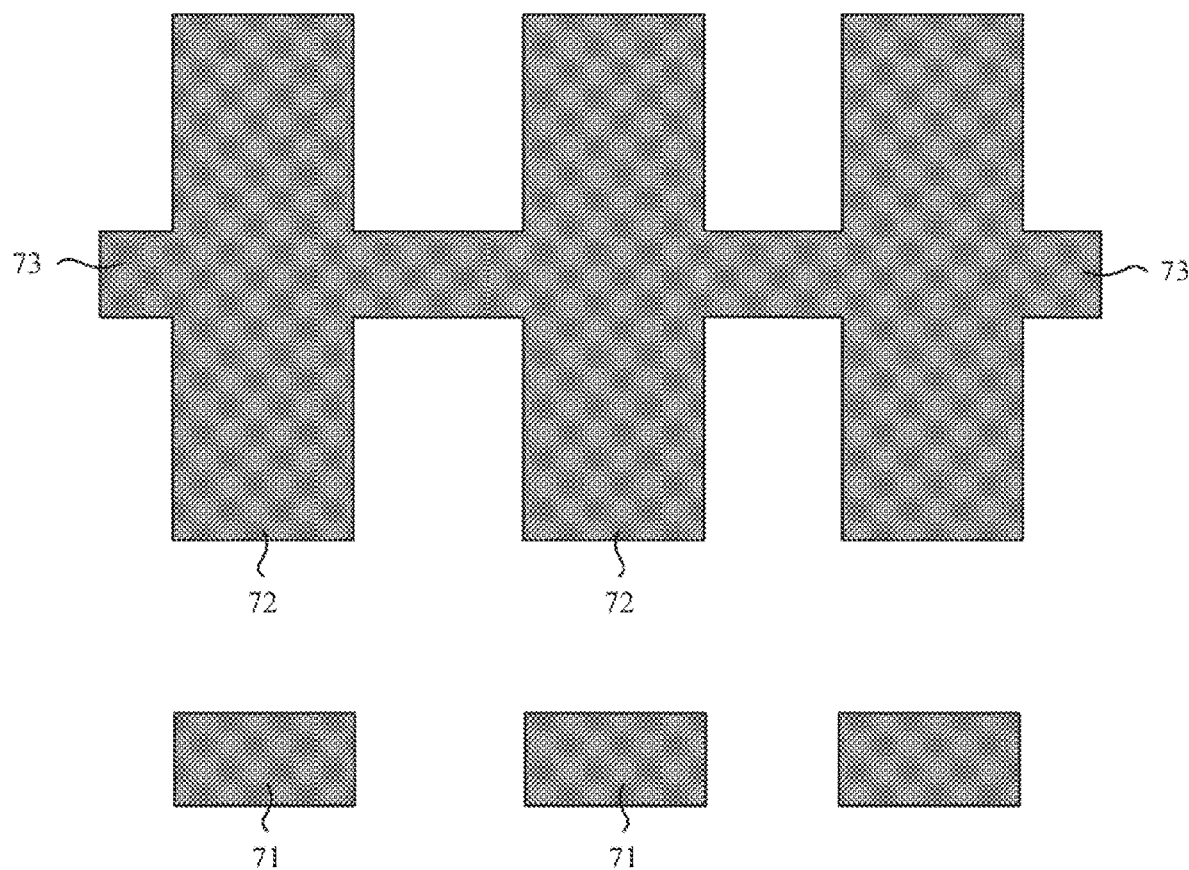

(15) A pattern of an eighth conductive layer is formed. In an exemplary embodiment, forming the pattern of the eighth conductive layer may include: depositing an eighth conductive film on the silicon base, on which the aforementioned patterns are formed, patterning the eighth conductive film through the patterning process to form the pattern of the eighth conductive layer on the eighth insulation layer, as shown in FIGS. 19A and 19B. FIG. 19B is a schematic diagram of the eighth conductive layer in FIG. 19A. In an exemplary embodiment, the eighth conductive layer may be referred to as a sixth metal (Metal6) layer or a second metal connection (TM2) layer.

In an exemplary embodiment, the eighth conductive layer in each sub-pixel may at least include an anode connection electrode 71, a power supply electrode 72 and a first power supply line 73.

In an exemplary embodiment, the anode connection electrode 71 may be in the shape of a rectangle. The anode connection electrode 71 may be connected to the sixty-first connection electrode 61 through the fifty-first via hole V51. The anode connection electrode 71 is configured to be connected to an anode formed later. Because the sixty-first connection electrode 61 is connected to the fifty-second connection electrode 52 through a via hole, the fifty-second connection electrode 52 is connected to the forty-second connection electrode 42 through a via hole, the forty-second connection electrode 42 is connected to the thirty-third connection electrode 33 through a via hole, the thirty-third connection electrode 33 is connected to the twenty-fourth connection electrode 24 through a via hole, and the twenty-fourth connection electrode 24 is connected to the second region of the second active layer and the second region of the third active layer respectively through via holes, the anode formed later can be connected to the second electrode of the second transistor T2 and the second electrode of the third transistor T3 (the second node N2 of the pixel driving circuit), so as to provide the current output by the pixel driving circuit to the anode.

In an exemplary embodiment, the power supply electrode 72 may be in the shape of a rectangle. The power supply electrode 72 may be connected to the second plate 92 through the fifty-second via hole V52. The first power supply line 73 may be in the shape of a line extending along the first direction D1. The first power supply line 73 is connected to the power supply electrode 72 of each sub-pixel such that the second plate 92 has the potential of the first power supply line 73.

In an exemplary embodiment, the power supply electrode 72 and the first power supply line 73 may be connected to each other to form an integrated structure.

In an exemplary embodiment, because the second plate 92 has the potential of the first power supply line 73 and the first plate 91 has the potential of the first node N1 of the pixel driving circuit, the first plate 91 and the second plate 92 constitute a storage capacitance of a MIM capacitive structure. In the present disclosure, the capacitance required for high PPI can be met and the driving capability of the pixel driving circuit can be improved by using the MIM capacitive structure, in which the capacitance value per unit area is higher.

In an exemplary embodiment, the subsequent manufacturing processes may include forming an anode, a pixel definition layer, an organic light emitting layer, a cathode, a first encapsulation layer, a color filter structure layer and a second encapsulation layer, the details thereof will not be repeated herein.

The structure of the display apparatus and the manufacturing process thereof in accordance with the exemplary embodiments of the present disclosure are described by way of example only. Corresponding structures may be changed and patterning processes may be added or reduced according to actual needs, and the present disclosure is not limited thereto. In an exemplary embodiment, the first insulation film through the eighth insulation film may be made of silicon oxide (SiOx), silicon nitride (SiNx) or silicon oxynitride (SiON), and may be single-layered structures or multi-layered composite structures. The first metal layer through the sixth metal layer may be made of a metal material, such as silver (Ag), copper (Cu), aluminum (Al) or molybdenum (Mo), or an alloy material consisting of metals, such as aluminum neodymium (AlNd) alloy or molybdenum niobium (MoNb) alloy. The alloy material may be a single-layer structure or multi-layer composite structure, such as a composite structure consisting of an Mo layer, a Cu layer and an Mo layer. In an exemplary embodiment, the planar shape of the via hole may be a rectangle, a circle or an ellipse, a plurality of via holes may be of the same size or different sizes, and the present disclosure is not limited thereto.

Figure 20:
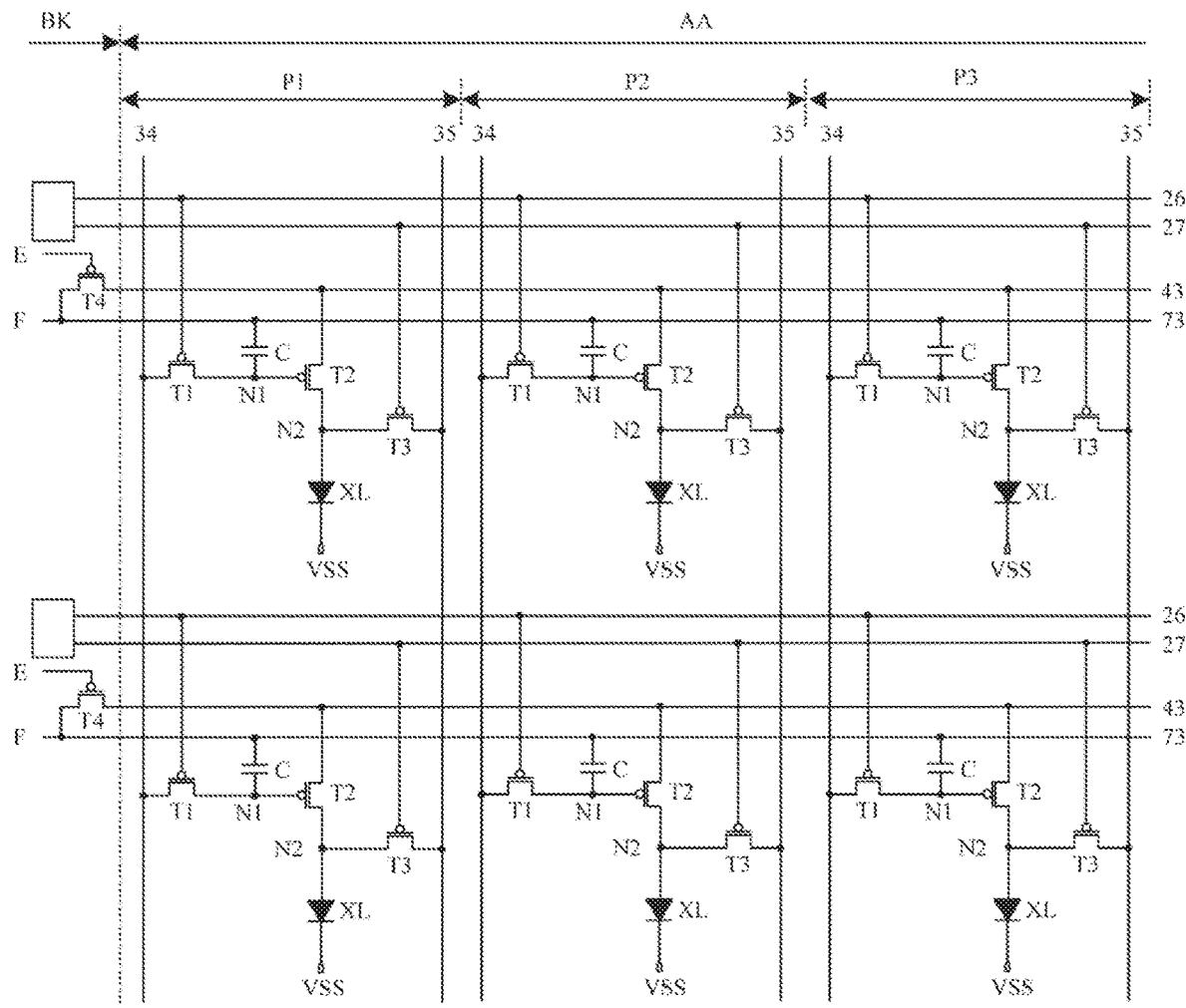
FIG. 20 is an equivalent circuit diagram of a display substrate in accordance with an exemplary embodiment of the present disclosure.

FIG. 20 is an equivalent circuit diagram of a display substrate in accordance with an exemplary embodiment of the present disclosure. As shown in FIG. 20, the display substrate may include a display area AA and a border area BK which may be disposed at one side of the display area AA.

In an exemplary embodiment, the display area AA may include a plurality of sub-pixels forming a plurality of pixel rows and a plurality of pixel columns, at least one sub-pixel includes a pixel driving circuit, which may include a first transistor T1, a second transistor T2, a third transistor T3 and a storage capacitor C. The pixel driving circuit is connected to a first scan signal line 26, a second scan signal line 27, a data signal line 34, a reference signal line 35, a light emitting voltage line 43, a first power supply line 73 and a first electrode of a light emitting device XL respectively. A second electrode of the light emitting device XL is connected to a second power supply line VSS. The first scan signal line 26, the second scan signal line 27, the light emitting voltage line 43 and the first power supply line 73 may extend along the pixel row direction, and be connected to pixel driving circuits in a plurality of sub-pixels in a pixel row. The data signal line 34 and the reference signal line 35 may extend along the pixel column direction, and be connected to pixel driving circuits in a plurality of sub-pixels in a pixel column.

In an exemplary embodiment, the border area BK may include a gate driving circuit, a light emitting control circuit and a border power supply lead.

In an exemplary embodiment, the gate driving circuit may include a plurality of cascaded gate driving units (shift registers). The gate driving circuit may be connected to the first scan signal line 26 and the second scan signal line 27 in each pixel row, and output a first scan signal and a second scan signal to the first scan signal line 26 and the second scan signal line 27, respectively.

In an exemplary embodiment, the light emitting control circuit may at least include a light emitting control transistor T4. A gate electrode of the light emitting control transistor T4 is connected to a light emitting control line E, a first electrode of the light emitting control transistor T4 is connected to a border power supply lead F, and a second electrode of the light emitting control transistor T4 is connected to the light emitting voltage line 43 in each pixel row. The light emitting control transistor T4 is configured to output a light emitting voltage to the light emitting voltage line 43 under the control of the light emitting control line E.

In an exemplary embodiment, the border power lead F is connected to the first power supply line 73 to continuously output high-level signals to the first power supply line 73.

In an exemplary embodiment, formation of the gate driving circuit, the light emitting control circuit and the border power supply lead in the border area may be in synchronization with formation of the pixel driving circuits in the display area, and will not be described herein.

It can be seen from the structure of the display apparatus and the manufacturing process thereof in accordance with the exemplary embodiments of the present disclosure, in the present disclosure, minimum designs such as lapping positions of gate electrodes all arranged in the same gap region, sharing of gate electrodes, sharing of drain electrodes, overturning of sub-pixels, etc., are adopted, to maximize the PPI of the display substrate and implement the highest PPI design of Real RGB silicon-based OLED in the industry. In the present disclosure, a via hole through which the first scan signal line is connected to the gate electrode of the first transistor T1, a via hole through which the second scan signal line is connected to the gate electrode of the third transistor T3, and a via hole through which the second electrode of the first transistor T1 is connected to the gate electrode of the second transistor T2 are all provided in the gap region of the sub-pixel, so as to form a structure in which the lapping positions of the gate electrodes in the sub-pixels are all located in the same gap region. In the present disclosure, the first transistors T1, the second transistors T2 and the third transistors T3 of two adjacent sub-pixels in the first direction are configured to be mirror symmetrical with respect to the pixel centerline to form a structure in which the sub-pixels are horizontally turned over with respect to the pixel centerline, such that the first gate electrodes of the two adjacent sub-pixels are connected to each other to form an integrated structure, and the third gate electrodes of the two adjacent sub-pixels are connected to each other to form an integrated structure, so as to form a structure in which the gate electrodes of the adjacent sub-pixels are shared. In the present disclosure, the second transistor T2 and the third transistor T3 are arranged along the second direction, such that the second electrode of the second transistor T2 and the second electrode of the third transistor T3 are connected to each other to form an integrated structure, to form a structure in which the drain electrodes in the sub-pixel are shared. In the present disclosure, the use of the MIM capacitive structure not only increases the capacitance value of the storage capacitor, but also guarantees the stability of the current output by the pixel driving circuit and the stability of the brightness of the OLED. In the present disclosure, the structural design described above is adopted, optimizing the layout of the pixel driving circuits and the layout space, reducing the occupied areas of the pixel driving circuits, improving the PPI of the display substrate maximally, and implementing the highest PPI design of the Real RGB silicon-based OLED in the industry, in which the resolution can reach 4 k*4 k, therefore higher display quality and display effect can be achieved.

An exemplary embodiment of the present disclosure further provides a manufacturing method of a display substrate. In an exemplary embodiment, the display substrate includes a display area and a border area, wherein the display area includes a plurality of sub-pixels forming pixel rows and pixel columns, a sub-pixel includes a first region, a gap region and a second region arranged in sequence along a pixel row direction. At least one sub-pixel includes a pixel driving circuit, a first scan signal line and a second scan signal line. The pixel driving circuit at least includes a first transistor, a second transistor and a third transistor. The first scan signal line is configured to control turning-on or turning-off of the first transistor, and the second scan signal line is configured to control turning-on or turning-off of the second transistor. The first transistor at least includes a first gate electrode, a first active layer, a first electrode and a second electrode of the first transistor, the second transistor at least includes a second gate electrode and a second active layer, and the third transistor at least includes a third gate electrode and a third active layer.

The manufacturing method includes: forming the first transistor, the second transistor, the third transistor, the first scan signal line and the second scan signal line, wherein the first active layer is disposed in the first region, the second active layer and the third active layer are disposed in the second region, and the second active layer is disposed at one side of the third active layer in a pixel column direction; the first gate electrode is connected to the first scan signal line through a first gate via hole, the second gate electrode is connected to the second electrode of the first transistor through a second gate via hole, the third gate electrode is connected to the second scan signal line through a third gate via hole, and the first gate via hole, the second gate via hole and the third gate via hole are provided in the gap region.

An exemplary embodiment of the present disclosure further provides a display apparatus including the display substrate described above. The display apparatus in accordance with the present disclosure may be applied in a virtual reality device or an augmented reality device. The display apparatus may include, but is not limited to, a mobile phone, a tablet computer, a television, a display, a notebook computer, a digital photo frame, a navigator or any product or component with a display function.

Although the embodiments disclosed in the present disclosure are described as above, the described contents are only embodiments which are adopted in order to facilitate understanding of the present disclosure, and are not intended to limit the present disclosure. Any skilled person in the art to which the present invention pertains can make any modifications and alterations in forms and details of implementations without departing from the spirit and scope of the present disclosure. However, the patent protection scope of the present disclosure should be subject to the scope defined by the appended claims.

The invention claimed is:

1. A display substrate, comprising a display area and a border area,
    wherein the display area comprises a plurality of sub-pixels forming a plurality of pixel rows and a plurality of pixel columns,
    a sub-pixel comprises a first region, a gap region and a second region arranged in sequence along a pixel row direction;
    at least one sub-pixel comprises a pixel driving circuit, a first scan signal line and a second scan signal line,
    the pixel driving circuit at least comprises a first transistor, a second transistor and a third transistor,
    the first scan signal line is configured to control turning-on or turning-off of the first transistor, and the second scan signal line is configured to control turning-on or turning-off of the second transistor;
    the first transistor at least comprises a first gate electrode, a first active layer, a first electrode and a second electrode of the first transistor, the second transistor at least comprises a second gate electrode and a second active layer, and the third transistor at least comprises a third gate electrode and a third active layer;
    the first active layer is disposed in the first region, the second active layer and the third active layer are disposed in the second region, and the second active layer is disposed in a plane at one side of the third active layer in a pixel column direction;
    the first scan signal line is connected to the first gate electrode through a first gate via hole, the second electrode of the first transistor is connected to the second gate electrode through a second gate via hole, the second scan signal line is connected to the third gate electrode through a third gate via hole, and the first gate via hole, the second gate via hole and the third gate via hole are provided in the gap region.

2. The display substrate according to claim 1, wherein long the pixel row direction, the first region has a first width, the second region has a second width, and the gap region has a third width, the third width is less than or equal to 0.5*the first width, and the third width is less than or equal to 0.5*the second width.

3. The display substrate according to claim 1, wherein first gate electrodes of two adjacent sub-pixels in a pixel row are connected to each other to form an integrated structure, and third gate electrodes of two adjacent sub-pixels in a pixel row are connected to each other to form an integrated structure.

4. The display substrate according to claim 3, wherein the first gate electrodes of the integrated structure are connected to the first scan signal line through two first gate via holes, and the third gate electrodes of the integrated structure are connected to the second scan signal line through two third gate via holes.

5. The display substrate according to claim 1, wherein first transistors, second transistors and third transistors of two adjacent sub-pixels in a pixel row are mirror symmetrical with respect to a pixel centerline, which is a straight line located between the two adjacent sub-pixels in the pixel row and extending along the pixel column direction.

6. The display substrate according to claim 1, wherein in at least one sub-pixel, the first gate electrode comprises a first gate body portion and a first gate connection portion connected to each other, the first gate connection portion is disposed in the gap region, and the first scan signal line is connected to the first gate connection portion through the first gate via hole;
    or
    in at least one sub-pixel, the second gate electrode comprises a second gate body portion and a second gate connection portion connected to each other, the second gate connection portion is disposed in the gap region, and the second electrode of the first transistor is connected to the second gate connection portion through the second gate via hole;
    or
    in at least one sub-pixel, the third gate electrode comprises a third gate body portion and a third gate connection portion connected to each other, the third gate connection portion is disposed in the gap region, and the second scan signal line is connected to the third gate connection portion through the third gate via hole.

7. The display substrate according to claim 1, wherein in at least one sub-pixel, the first gate electrode comprises a first gate body portion and a first gate connection portion connected to each other, the first gate connection portion is disposed at one side of the first gate body portion close to the third gate electrode, and the third gate electrode comprises a third gate body portion and a third gate connection portion connected to each other, the third gate connection portion is disposed at one side of the third gate body portion close to the first gate electrode, and the first gate connection portion and the third gate connection portion are interlaced in the pixel column direction.

8. The display substrate according to claim 7, wherein an edge of the first gate body portion and an edge of the first gate connection portion that are away from the second transistor are flush, and an edge of the third gate body portion and an edge of the third gate connection portion that are close to the second transistor are flush.

9. The display substrate according to claim 1, wherein in at least one sub-pixel, the second gate electrode comprises a second gate body portion and a second gate connection portion connected to each other, the second gate connection portion is disposed in the gap region, and an edge of the second gate body portion and an edge of the second gate connection portion that are close to the third transistor are flush.

10. The display substrate according to claim 1, wherein a main part of the first scan signal line and a main part of the second scan signal line are in a shape of a line extending along the pixel row direction, an orthographic projection of the first scan signal line on a plane of the display substrate at least partially overlaps with orthographic projections of the first gate electrode and the third gate electrode on the plane of the display substrate, and an orthographic projection of the second scan signal line on the plane of the display substrate at least partially overlaps with the orthographic projections of the first gate electrode and the third gate electrode on the plane of the display substrate.

11. The display substrate according to claim 1, wherein the second transistor further comprises a first electrode and a second electrode of the second transistor, and the third transistor further comprises a first electrode and a second electrode of the second transistor, the first electrode of the first transistor is connected to a data signal line, the first electrode of the second transistor is connected to a light emitting voltage line, the first electrode of the third transistor is connected to a reference signal line, and the second electrode of the second transistor and the second electrode of the third transistor are connected to each other to form an integrated structure.

12. The display substrate according to claim 1, wherein in at least one sub-pixel, the pixel driving circuit further comprises a storage capacitor comprising a first plate and a second plate, an orthographic projection of the first plate on a plane of the display substrate at least partially overlaps with an orthographic projection of the second plate on the plane of the display substrate, the first plate is connected to the second electrode of the first transistor through a connection electrode, and the second plate is connected to a first power supply line.

13. The display substrate according to claim 1, wherein at least one sub-pixel further comprises a contact electrode disposed in the first region, the contact electrode is disposed at one side of the first active layer in the pixel column direction.

14. The display substrate according to claim 13, wherein at least one sub-pixel further comprises a bias voltage line connected to the contact electrode through a via hole, an orthographic projection of the bias voltage line on a plane of the display substrate at least partially overlaps with an orthographic projection of the second gate electrode on the plane of the display substrate.

15. The display substrate according to claim 14, wherein in at least one sub-pixel, the contact electrode is in a shape of a strip extending along the pixel column direction, the bias voltage line is in a shape of a line extending along the pixel row direction, a bias connection line is connected at one or both sides of the bias voltage line in the pixel column direction, an orthographic projection of the bias connection line on the plane of the display substrate at least partially overlaps with an orthographic projection of the contact electrode on the plane of the display substrate, and the bias connection line is connected to the contact electrode through a via hole.

16. The display substrate according to claim 15, wherein the bias voltage line and the bias connection line are connected to each other to form an integrated structure.

17. The display substrate according to claim 1, wherein the border area at least comprises a light emitting control transistor, a gate electrode of the light emitting control transistor is connected to a light emitting control line, a first electrode of the light emitting control transistor is connected to a border power supply lead, a second electrode of the light emitting control transistor is connected to the light emitting voltage line, which is connected to first electrodes of second transistors of a plurality of sub-pixels in a pixel row, and the border power supply lead is connected to the first power supply line.

18. The display substrate according to claim 1, wherein in a plane perpendicular to the display substrate, the display substrate at least comprises a first conductive layer and a second conductive layer disposed in sequence on a silicon base, the silicon base at least comprises the first active layer, the second active layer and the third active layer, the first conductive layer at least comprises the first gate electrode, the second gate electrode and the third gate electrode, and the second conductive layer at least comprises the first scan signal line and the second scan signal line.

19. A display apparatus, comprising the display substrate according to claim 1.

20. A manufacturing method of a display substrate comprising a display area and a border area, wherein the display area comprises a plurality of sub-pixels forming pixel rows and pixel columns, a sub-pixel comprises a first region, a gap region and a second region arranged in sequence along a pixel row direction;

at least one sub-pixel comprises a pixel driving circuit, a first scan signal line and a second scan signal line, the pixel driving circuit at least comprises a first transistor, a second transistor and a third transistor, the first scan signal line is configured to control turning-on or turning-off of the first transistor, and the second scan signal line is configured to control turning-on or turning-off of the second transistor;

the first transistor at least comprises a first gate electrode, a first active layer, a first electrode and a second electrode of the first transistor, the second transistor at least comprises a second gate electrode and a second active layer, and the third transistor at least comprises a third gate electrode and a third active layer; the manufacturing method comprises:

forming the first transistor, the second transistor, the third transistor, the first scan signal line and the second scan signal line, wherein the first active layer is disposed in the first region, the second active layer and the third active layer are disposed in the second region, and the second active layer is disposed in a plane at one side of the third active layer in a pixel column direction;

the first gate electrode is connected to the first scan signal line through a first gate via hole, the second gate electrode is connected to the second electrode of the first transistor through a second gate via hole, the third gate electrode is connected to the second scan signal line through a third gate via hole, and the first gate via hole, the second gate via hole and the third gate via hole are provided in the gap region.

\* \* \* \* \*